US011862254B2

(12) United States Patent
Li et al.

(10) Patent No.: US 11,862,254 B2
(45) Date of Patent: Jan. 2, 2024

(54) SEMICONDUCTOR INTEGRATED CIRCUIT

(71) Applicant: Kioxia Corporation, Tokyo (JP)

(72) Inventors: Dongxu Li, Yokohama (JP); Kiyotaro Itagaki, Ota (JP); Kazuaki Kawaguchi, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 206 days.

(21) Appl. No.: 17/410,254

(22) Filed: Aug. 24, 2021

(65) Prior Publication Data

US 2022/0270690 A1 Aug. 25, 2022

(30) Foreign Application Priority Data

Feb. 19, 2021 (JP) ................................ 2021-025415

(51) Int. Cl.

*G11C 8/00* (2006.01)
*G11C 16/32* (2006.01)
*G06F 13/16* (2006.01)
*G11C 16/26* (2006.01)
*G11C 16/04* (2006.01)

(52) U.S. Cl.

CPC .......... *G11C 16/32* (2013.01); *G06F 13/1668* (2013.01); *G11C 16/0483* (2013.01); *G11C 16/26* (2013.01)

(58) Field of Classification Search

CPC ......... G11C 7/22; G11C 7/222; G11C 7/1072; G11C 7/1066; G11C 7/1051
USPC ............................ 365/233.1, 233.11, 233.14
See application file for complete search history.

(56) References Cited

U.S. PATENT DOCUMENTS 7,436,717 B2 10/2008 Hidaka
7,952,948 B2 5/2011 Lee
10,586,599 B1 3/2020 Kubota et al.
10,916,276 B2 2/2021 Yamamoto et al.
2006/0029175 A1* 2/2006 Schnarr ................ G11C 7/1051 327/158
2011/0175670 A1* 7/2011 Shishido ............. H01L 27/1225 327/427
2019/0004643 A1* 1/2019 Ma ........................... G09G 3/20
2019/0371371 A1 12/2019 Park et al.

FOREIGN PATENT DOCUMENTS

JP H8-221977 A 8/1996
JP 2020-47340 A 3/2020
JP 2020-102286 A 7/2020
TW 202005241 A 1/2020

* cited by examiner

*Primary Examiner* — Son T Dinh
(74) *Attorney, Agent, or Firm* — Oblon, McClelland, Maier & Neustadt, L.L.P.

(57) ABSTRACT

According to one embodiment, a semiconductor integrated circuit includes a first signal line including a first part and a second part, a second signal line including a third part and a fourth part, a first inverter, a second inverter, and a control circuit. A first signal is input to the first part in a first period. A second signal is input to the third part in a second period. The first inverter outputs, to the second part, a first inverted signal obtained such that a logic of the first signal is inverted. The second inverter outputs, to the fourth part, a second inverted signal obtained such that a logic of the second signal is inverted. The control circuit brings the second signal line into a floating state in the first period, and brings the first signal line into a floating state in the second period.

17 Claims, 14 Drawing Sheets

FIG. 15

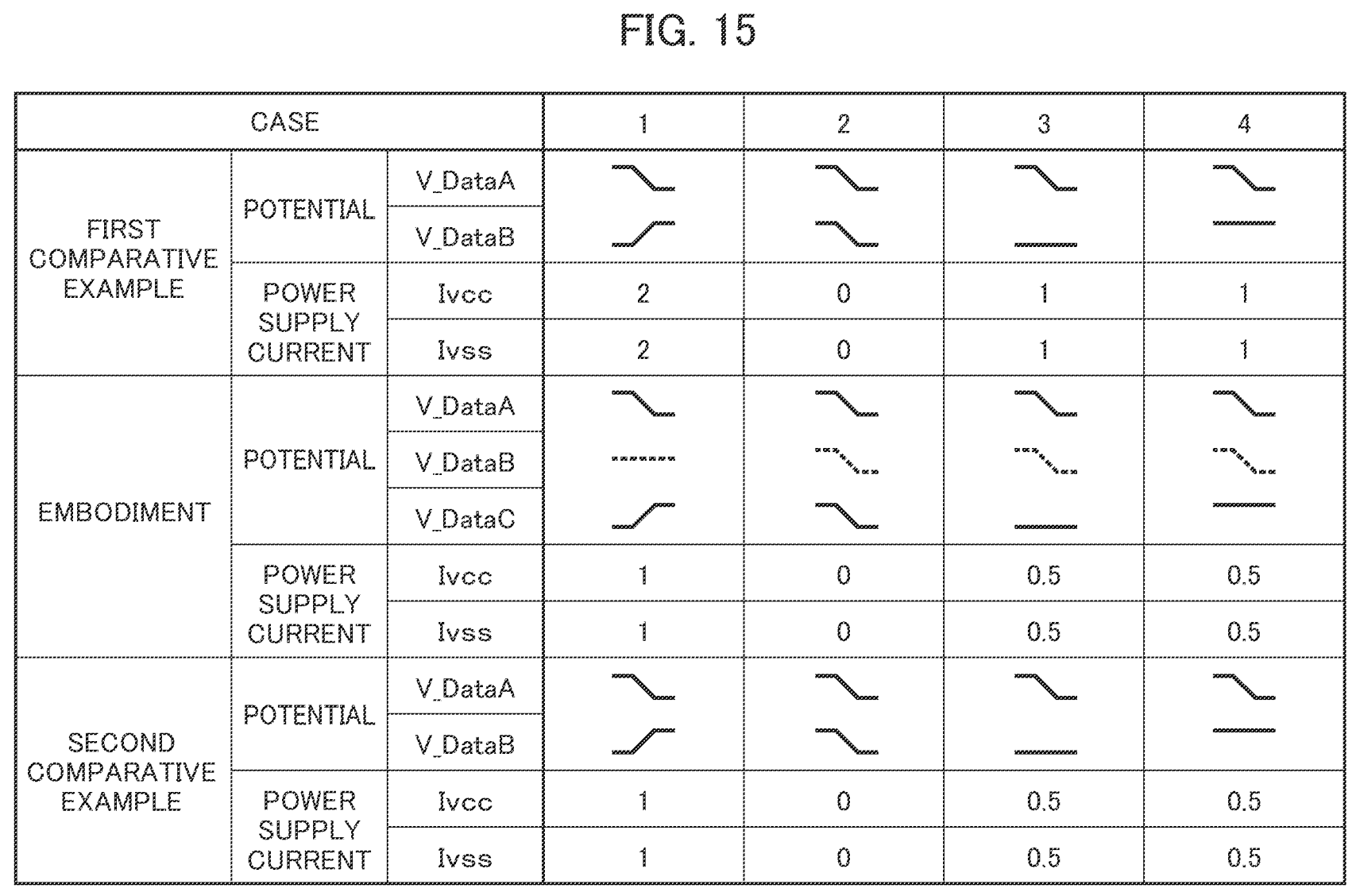

| CASE | | | 1 | 2 | 3 | 4 |
|---|---|---|---|---|---|---|
| FIRST COMPARATIVE EXAMPLE | POTENTIAL | V_DataA | | | | |
| | | V_DataB | | | | |
| | POWER SUPPLY CURRENT | Ivcc | 2 | 0 | 1 | 1 |
| | | Ivss | 2 | 0 | 1 | 1 |
| EMBODIMENT | POTENTIAL | V_DataA | | | | |
| | | V_DataB | | | | |
| | | V_DataC | | | | |
| | POWER SUPPLY CURRENT | Ivcc | 1 | 0 | 0.5 | 0.5 |
| | | Ivss | 1 | 0 | 0.5 | 0.5 |
| SECOND COMPARATIVE EXAMPLE | POTENTIAL | V_DataA | | | | |
| | | V_DataB | | | | |
| | POWER SUPPLY CURRENT | Ivcc | 1 | 0 | 0.5 | 0.5 |
| | | Ivss | 1 | 0 | 0.5 | 0.5 |

SEMICONDUCTOR INTEGRATED CIRCUIT

CROSS-REFERENCE TO RELATED APPLICATIONS

This application is based upon and claims the benefit of priority from prior Japanese Patent Application P2021-025415 filed on Feb. 19, 2021; the entire contents of which are incorporated by reference herein.

BACKGROUND OF THE INVENTION

Field

Embodiments described herein relate generally to semiconductor integrated circuits.

Semiconductor integrated circuits increase power consumption because of capacitive coupling between signal wires when signals are transmitted therethrough. Increasing a gap between the signal lines to decrease the coupling capacitance between the signal lines can reduce the increase in the power consumption, while the area of a chip is increased.

BRIEF DESCRIPTION OF THE DRAWINGS

FIG. 15 is a table showing a comparison of power supply currents.

Figure 1:
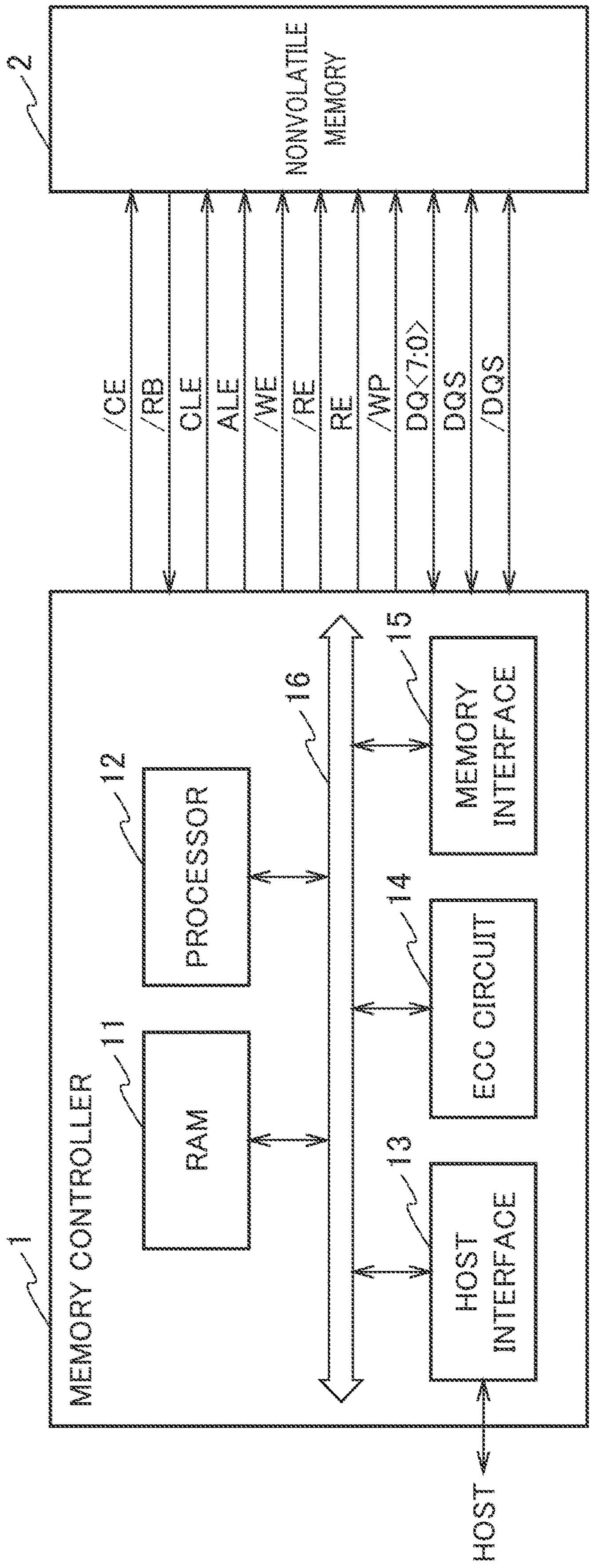
FIG. 1 is a block diagram illustrating a configuration of a memory system including a nonvolatile memory having a semiconductor integrated circuit according to an embodiment.

According to one embodiment, a semiconductor integrated circuit includes a first signal line including a first part and a second part, a second signal line including a third part and a fourth part, a first inverter arranged between the first part and the second part of the first line, a second inverter arranged between the third part and the fourth part of the second signal line, and a control circuit. A first signal is input to the first part of the first signal line in response to a first clock signal in a first period. A second signal is input to the third part of the second signal line in response to a second clock signal in a second period after the first period. The first inverter outputs, to the second part, a first inverted signal obtained such that a logic of the first signal is inverted. The second inverter outputs, to the fourth part, a second inverted signal obtained such that a logic of the second signal is inverted. The control circuit brings the second signal line into a floating state in the first period, and brings the first signal line into a floating state in the second period.

The embodiment is described in detail below with reference to the drawings. The same elements illustrated in the drawings are denoted by the same reference numerals, and overlapping explanations are not repeated below.

The semiconductor integrated circuit according to the embodiment of the present invention is a nonvolatile memory 2 included in a memory system illustrated in FIG. 1, for example. The nonvolatile memory 2 is a semiconductor memory that can store data in a nonvolatile manner. The nonvolatile memory 2 includes a NAND flash memory, for example. A memory controller 1 controls the operation of the nonvolatile memory 2. A host is an electronic device such as a personal computer or a mobile terminal.

The memory system illustrated in FIG. 1 is described below. As used herein, reference sign "signal DQ<7:0>" refers to a gathering of signals DQ<0>, DQ<1>, . . . DQ<7> that are each a signal of one bit. The signal DQ<7:0> is a signal of eight bits.

The memory controller 1 receives a command from the host, and controls the nonvolatile memory 2 in accordance with the received command. In particular, the memory controller 1 writes the data instructed to be write by the host in the nonvolatile memory 2, and reads the date instructed to be read by the host from the nonvolatile memory 2 so as to send the data to the host. A nonvolatile memory cell in the nonvolatile memory 2 in which the data is to be written is assigned by the memory controller 1. The nonvolatile memory cell in the nonvolatile memory 2 is also referred to below as a "memory cell".

The memory controller 1 and the nonvolatile memory communicate with each other to send/receive signals according to interface standards between the memory controller 1 and the nonvolatile memory 2 via individual signal lines. Examples of signals sent/received between the memory controller 1 and the nonvolatile memory 2 include /CE, /RB, CLE, ALE, /WE, /RE, RE, /WP, DQ<7:0>, DQS, and /DQS.

The signal /CE is a chip enable signal that enables the nonvolatile memory 2. The signal /RB is a ready/busy signal indicating that the nonvolatile memory 2 is in a ready state (a state of accepting an external command) or in a busy state (a state of rejecting an external command). The signal CLE is a command latch enable signal that notifies the nonvolatile memory 2 of the information that the signal DQ<7:0> sent to the nonvolatile memory 2 is a command when the signal CLE is at a high (H) level. The signal ALE is an address latch enable signal that notifies the nonvolatile memory 2 of the information that the signal DQ<7:0> sent to the nonvolatile memory 2 is an address when the signal ALE is at the H level.

The signal /WE is a write enable signal that instructs the nonvolatile memory 2 to load the signal DQ<7:0> when sent to the nonvolatile memory 2. The signal /WE instructs the nonvolatile memory 2 to load the signal DQ<7:0> as a command, an address, or data sent to the nonvolatile memory 2 at a rising edge of the signal /WE in a single data rate (SDR) mode. The signal /WE also instructs the nonvolatile memory 2 to load the signal DQ<7:0> as a command or an address sent to the nonvolatile memory 2 at the rising edge of the signal /WE in a double data rate (DDR) mode. The signal /WE is asserted every time the nonvolatile memory 2 receives the command, the address, and the data from the memory controller 1.

The signal /RE is a read enable signal that instructs the operation of reading the signal DQ<7:0> from the nonvolatile memory 2 by the memory controller 1. The signal RE is a complementary signal of the signal /RE. For example, the signals /RE and RE are used for controlling an operating timing of the nonvolatile memory 2 when outputting the signal DQ<7:0>. In particular, the signal /RE instructs the nonvolatile memory 2 to output the signal DQ<7:0> as data at a falling edge of the signal /RE in the single data rate mode. The signal /RE also instructs the nonvolatile memory 2 to output the signal DQ<7:0> as data at the falling edge and the rising edge of the signal /RE in the double data rate mode.

The signal /WP is a write protect signal that instructs the nonvolatile memory 2 to write-protect data. The signal DQ<7:0> is an entity of data sent/received between the nonvolatile memory 2 and the memory controller 1, and includes a command CMD, an address ADD, and data DAT. The data DAT includes write data and readout data.

The signal DQS is a data strobe signal used for controlling the operating timing of the nonvolatile memory 2 regarding the signal DQ<7:0>. The signal /DQS is a complementary signal of the signal DQS. The signals DQS and /DQS are generated on the basis of the signals RE and /RE. In particular, the signal DQS instructs the nonvolatile memory 2 to load the signal DQ<7:0> as data at the falling edge and the rising edge of the signal DQS in the double data rate mode. The signal DQS is generated in accordance with the falling edge and the rising edge of the signal /RE in the double data rate mode, and is output together with the signal DQ<7:0> as data from the nonvolatile memory 2.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via a bus 16.

The RAM 11 temporarily stores data received from the host until the data is saved in the nonvolatile memory 2, or temporarily stores data read from the nonvolatile memory 2 until the data is sent to the host. The RAM 11 is a general-purpose semiconductor memory such as a static random access memory (SRAM) or a dynamic random access memory (DRAM).

The processor 12 controls the entire operation of the memory controller 1. The processor 12 is a processing unit such as a central processing unit (CPU) and a micro processing unit (MPU). The processor 12 responds to a command to read out data received from the host, and issues the readout command to the nonvolatile memory 2, for example. This operation is also applied to a case of data writing. The processor 12 determines a storage region (a memory region) in the nonvolatile memory 2 for the data accumulated in the RAM 11. The processor 12 has a function of executing various kinds of mathematical operations for the data read from the nonvolatile memory 2.

The host interface 13 is connected to the host so as to execute the processing according to interface standards between the host and the host interface 13. The host interface 13 transfers the command and the data received from the host to the processor 12, for example. The host interface 13 also sends the data read from the nonvolatile memory 2, the response from the processor 12 to the host, and the like.

The ECC circuit 14 encodes the data stored in the RAM 11 to generate code words. The ECC circuit 14 also decodes code words read from the nonvolatile memory 2.

The memory interface 15 is connected to the nonvolatile memory 2 via the bus so as to establish communications with the nonvolatile memory 2. The memory interface 15 sends the command CMD, the address ADD, and the write data to the nonvolatile memory 2 in response to the instruction received from the processor 12. The memory interface 15 also receives the readout data from the nonvolatile memory 2.

While FIG. 1 illustrates the configuration example in which the memory controller 1 includes the ECC circuit and the memory interface 15, the ECC circuit 14 may be housed in the memory interface 15, or the ECC circuit 14 may be housed in the nonvolatile memory 2 instead.

The memory system, when receiving the write command from the host, operates as follows. The processor 12, when instructed to write data, temporarily stores the corresponding data in the RAM 11. The processor 12 reads out the data stored in the RAM 11, and inputs the data to the ECC circuit 14. The ECC circuit 14 encodes the input data, and inputs the code words to the memory interface 15. The memory interface 15 writes the input code words in the nonvolatile memory 2.

The memory system, when receiving the readout command from the host, operates as follows. The memory interface 15 inputs the code words read from the nonvolatile memory 2 to the ECC circuit 14. The ECC circuit 14 decodes the input code words, and stores the decoded data in the RAM 11. The processor 12 sends the data stored in the RAM 11 to the host via the host interface 13.

Figure 2:
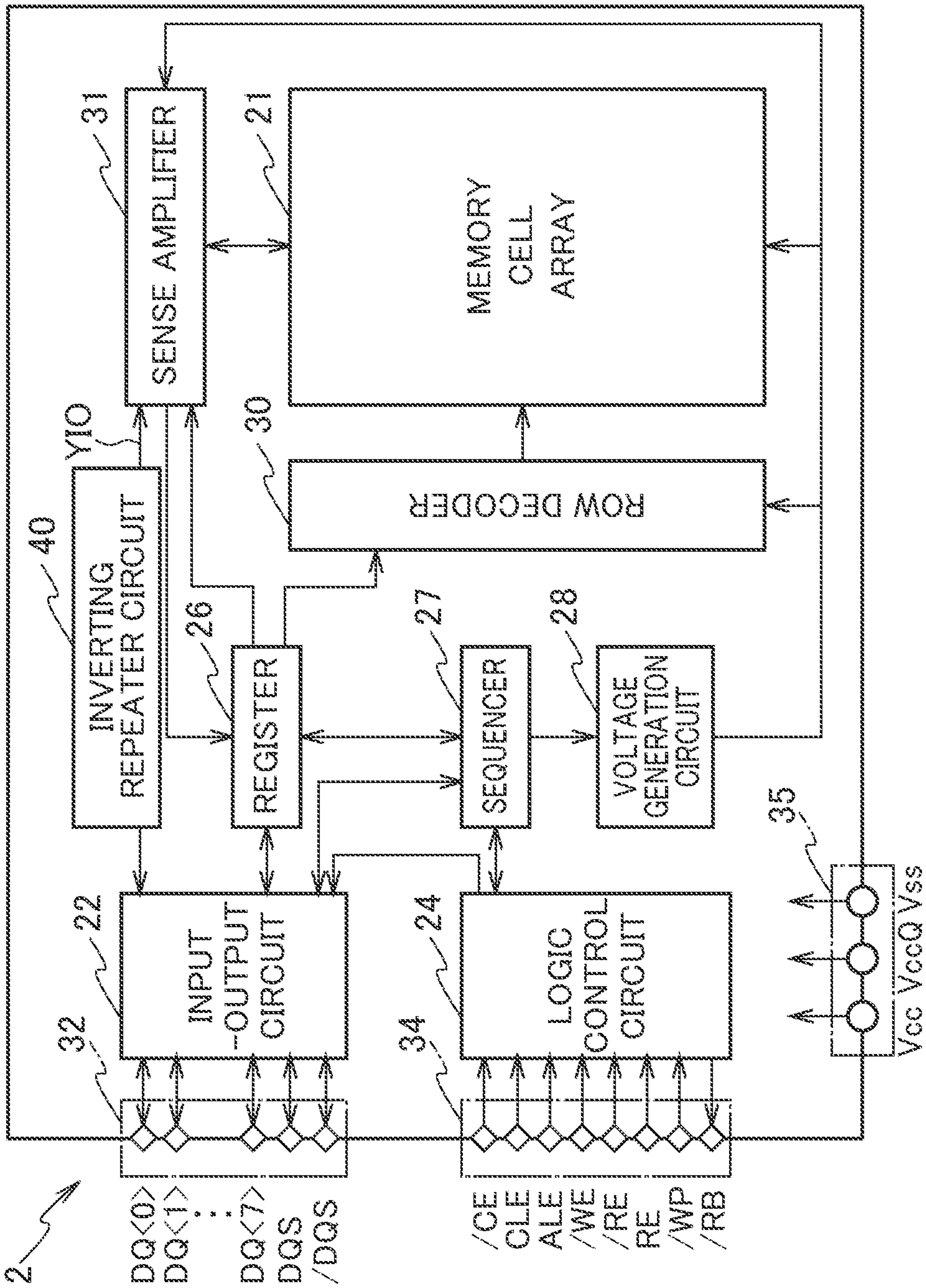
FIG. 2 is a block diagram illustrating a configuration of the nonvolatile memory according to the embodiment.

FIG. 2 is a block diagram showing an example of the configuration of the nonvolatile memory 2. The nonvolatile memory 2 includes a memory cell array 21, an input-output circuit 22, a logic control circuit 24, a register 26, a sequencer 27, a voltage generation circuit 28, a row decoder 30, a sense amplifier 31, and an inverting repeater circuit 40. The nonvolatile memory 2 further includes a pad group for input/output 32, a pad group for logic control 34, and a terminal group for power supply input 35.

The memory cell array 21 includes a plurality of memory cells (not illustrated) associated with word lines and bit lines.

The input-output circuit 22 communicates with the memory controller 1 to send/receive the signal DQ<7:0>, the signal DQS, and the signal /DQS therebetween. The input-output circuit 22 transfers the command CMD and the address ADD in the signal DQ<7:0> to the register 26. The input-output circuit 22 also communicates with the sense amplifier 31 to send/receive the write data and the readout data therebetween.

The logic control circuit 24 receives the signals /CE, CLE, ALE, /WE, /RE, RE, /WP, and /RB from the memory controller 1. The logic control circuit 24 transfers the signal /RB to the memory controller 1 so as to externally notify the state of the nonvolatile memory 2.

The register 26 holds the command CMD and the address ADD. The register 26 transfers the address ADD to the row decoder 30 and the sense amplifier 31, and transfers the command CMD to the sequencer 27.

The sequencer 27 receives the command CMD so as to control the entire nonvolatile memory 2 in accordance with a sequence based on the command CMD received.

The voltage generation circuit 28 generates voltage necessary for the operations, such as writing of data, readout of data, and deletion of data, in accordance with the instruction from the sequencer 27. Various types of voltage are supplied to the row decoder 30, the sense amplifier 31, and the memory cell array 21 from the voltage generation circuit 28 in accordance with the address from the register 26.

The row decoder 30 receives a block address and a row address in the address ADD from the register 26. The row decoder 30 chooses a block based on the block address, and chooses a word line based on the row address.

The sense amplifier 31 senses the readout data read to the bit line from the memory cell upon the readout of the data, and transfers the sensed readout data to the input-output circuit 22. The sense amplifier 31 transfers the write data to the memory cell via the bit line upon the writing of the data.

The data is transferred from the sense amplifier 31 to the input-output circuit 22 via a data bus YIO. The data written in the nonvolatile memory 2 and the data read from the nonvolatile memory 2 are transmitted through the data bus YIO.

The inverting repeater circuit 40 is arranged around the middle of the data bus YIO. The inverting repeater circuit 40 can avoid or reduce an increase in power supply current flowing through the data bus YIO, which is described in detail below.

The pad group for input/output 32 includes a plurality of terminals (pads) corresponding to the signal DQ<7:0> and the signals DQS and /DQS so as to send/receive various kinds of signals including data between the nonvolatile memory 2 and the memory controller 1.

The pad group for logic control 34 includes a plurality of terminals (pads) corresponding to the signals /CE, CLE, ALE, /WE, /RE, RE, /WP, and /RB so as to send/receive various kinds of signals between the nonvolatile memory 2 and the memory controller 1.

The terminal group for power supply input 35 includes a plurality of terminals to which power supply voltages Vcc and VccQ and a ground voltage Vss are input so as to externally supply various types of operating power sources to the nonvolatile memory 2. The power supply voltage Vcc is a circuit power supply voltage typically externally supplied as an operating power source. The power supply voltage Vcc is 2.5 V, for example. The power supply voltage VccQ is used when signals are sent/received between the memory controller 1 and the nonvolatile memory 2. The power supply voltage VccQ is 1.2 V, for example.

Figure 3A:
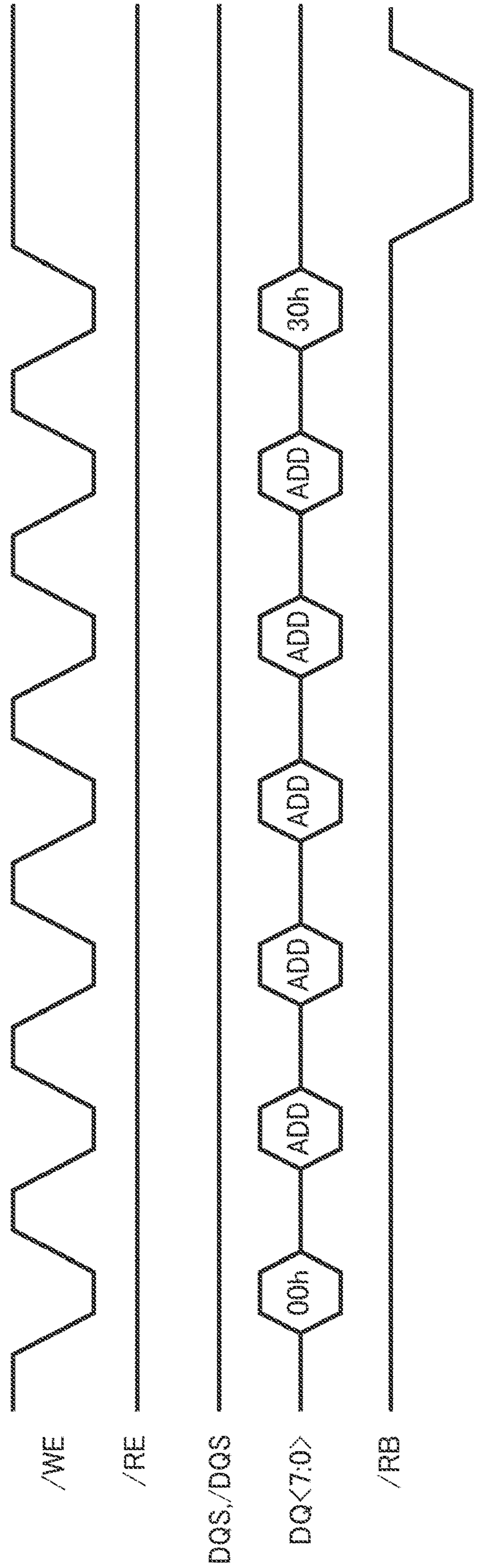
FIG. 3A is a diagram showing an example of a command sequence for instructing a readout operation of the nonvolatile memory.
Figure 3B:
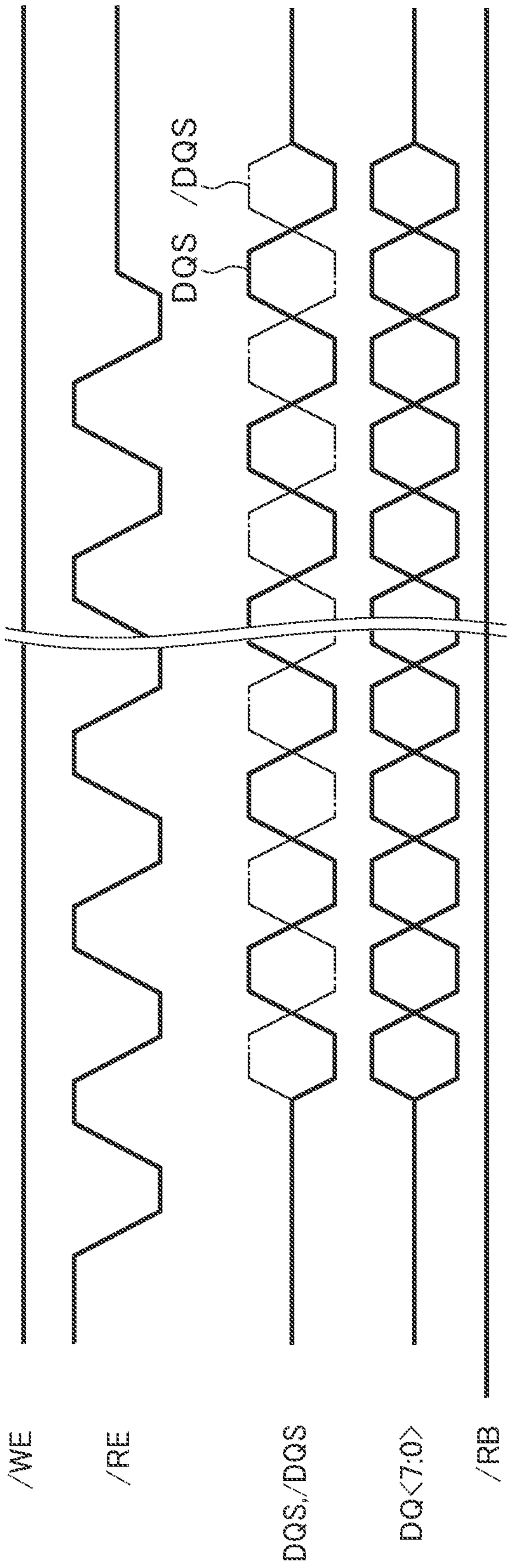
FIG. 3B is a diagram showing an example of a command sequence regarding the readout operation for data from the nonvolatile memory.

FIG. 3A is a diagram showing an example of a command sequence for instructing the readout operation of the nonvolatile memory 2. FIG. 3B is a diagram showing an example of a command sequence regarding the readout operation for data from the nonvolatile memory 2.

As shown in FIG. 3A, the memory controller 1 sequentially issues a readout command "00h", addresses ADD for five cycles, and a command "30h", and sends these commands and addresses to the nonvolatile memory 2 while toggling the signal /WE upon the readout operation. The readout command "00h" is a command for commanding the nonvolatile memory 2 to read the data from the memory cell array 21. The command "30h" is a command for commanding the start of the readout operation. The nonvolatile memory 2 starts the operation of reading the data from the memory cell array 21 when receiving the command "30h" and sets the signal /RB to the L level to notify the memory controller 1 of the information that the nonvolatile memory 2 is in the busy state. After the completion of the readout of the data from the memory cell array 21, the nonvolatile memory 2 sets the signal /RB to the H level to notify the memory controller 1 of the information that the nonvolatile memory 2 is in the ready state.

The memory controller 1 toggles the signals /RE and RE after confirming that the nonvolatile memory 2 is in the ready state, as shown in FIG. 3B. The nonvolatile memory 2 transfers the read data synchronized with the signals /RE and RE as the signal DQ<7:0> to the memory controller 1. The nonvolatile memory 2 toggles the signals DQS and /DQS synchronized with the signal DQ<7:0>, and transfers the signals to the memory controller 1.

Figure 4:
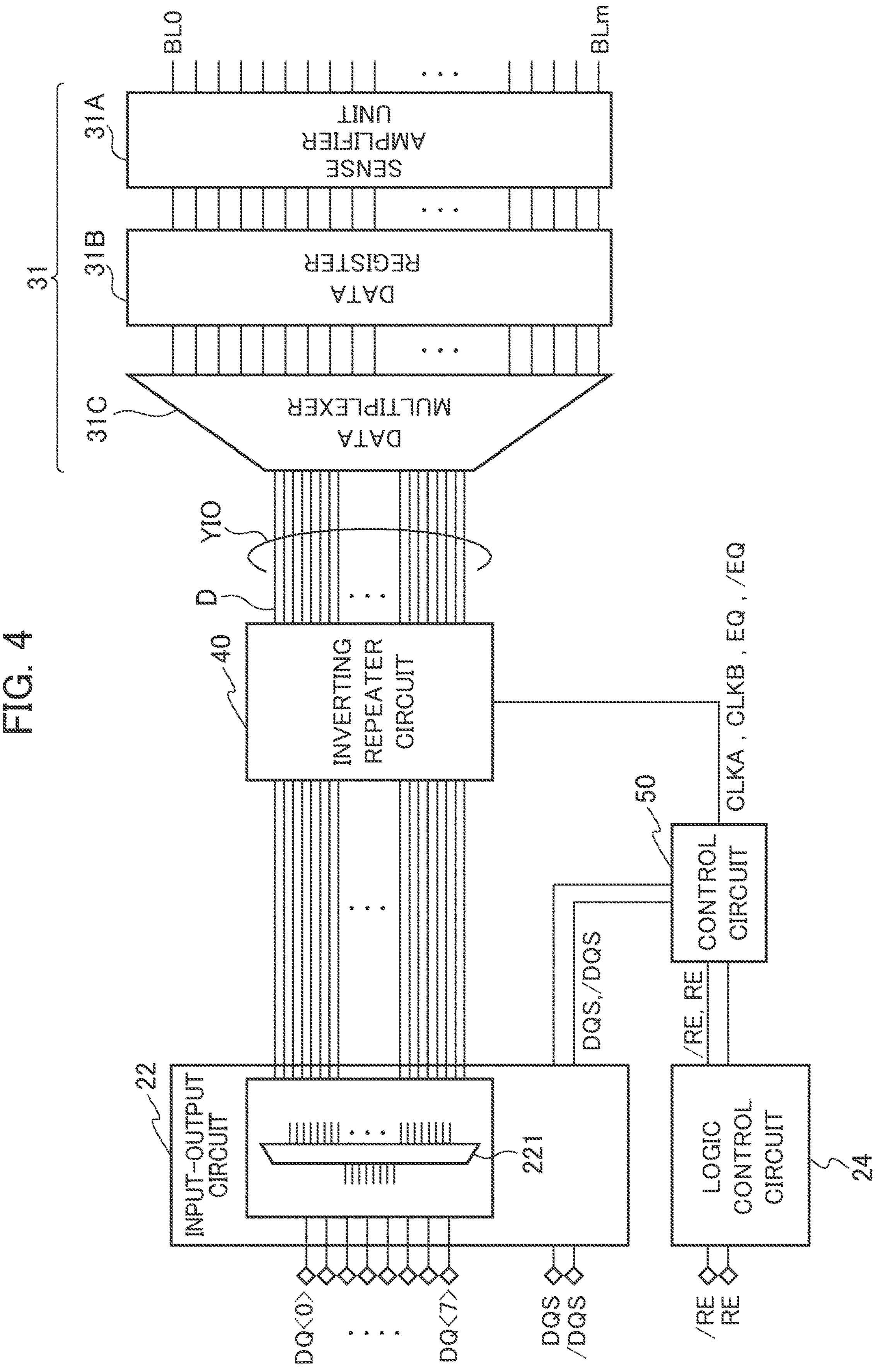
FIG. 4 is a block diagram illustrating a part of the configuration of the nonvolatile memory according to the embodiment.

FIG. 4 is a block diagram illustrating part of the configuration of the nonvolatile memory 2 including the input-output circuit 22, the sense amplifier 31, the inverting repeater circuit 40, and the data bus YIO. The input-output circuit 22 communicates with the sense amplifier 31 to send/receive the write data and the readout data therebetween via the data bus YIO. The data bus YIO includes a plurality of signal lines D. The data bus YIO includes 128 signal lines D, for example.

The sense amplifier 31 includes a sense amplifier unit 31A connected to the bit lines BL0 to BLm, a data register 31B connected to the sense amplifier unit 31A, and a data multiplexer 31C connected to the data register 31B. The number of the bit lines is about 130 thousand, for example. The sense amplifier unit 31A senses the readout data read to the bit lines, and transfers the write data to the memory cells via the bit lines. The data register 31B stores the readout data and the write data. The data multiplexer 31C chooses the data transmitted through the signal lines D composing the data bus YIO from the data transmitted through the bit lines BL0 to BLm.

The input-output circuit 22 may include a conversion circuit 221 that changes a bus width. The conversion circuit 221 changes the bus width of the data bus YIO including the 128 signal lines, for example, so as to lead the bus to have eight signal lines through which the signal DQ<7:0> is transmitted. The conversion circuit 221 may be a first-in first-out (FIFO) circuit. The power supply voltage Vcc (2.5 V, for example) is applied between the sense amplifier 31 and the conversion circuit 221 so as to operate. The power supply voltage VccQ (1.2 V, for example) is applied between the conversion circuit 221 and the memory controller 1 so as to operate.

The inverting repeater circuit 40 is controlled by a control circuit 50. FIG. 4 illustrates the control circuit 50 as a circuit block different from the input-output circuit 22 and the logic control circuit 24. The control circuit 50 may be implemented as a part of the input-output circuit 22 and/or the logic control circuit 24.

Figure 5:
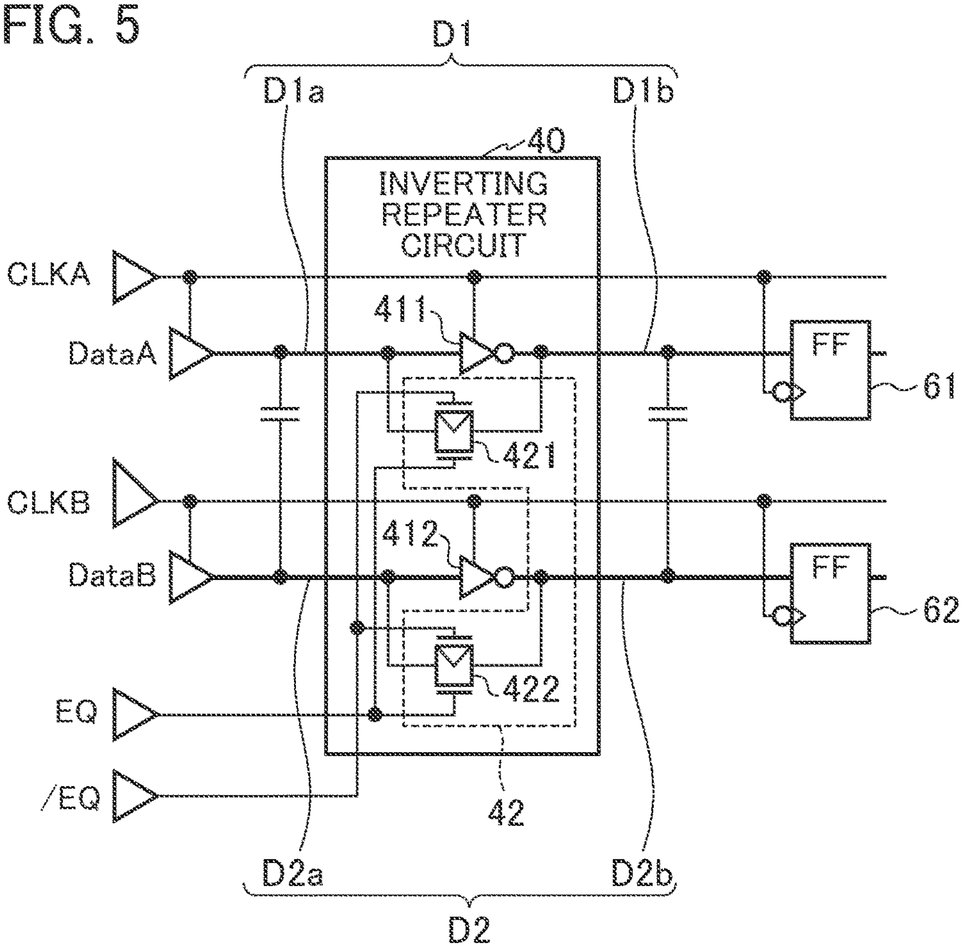
FIG. 5 is a circuit diagram showing a first example of an inverting repeater circuit according to the embodiment.

FIG. 5 is a diagram showing an example of the configuration of the inverting repeater circuit 40. The inverting repeater circuit 40 illustrated in FIG. 5 is connected to a first signal line D1 and a second signal line D2. At least a part of the first signal line D1 and at least a part of the second signal line D2 extend in the same direction adjacent to each other. The first signal line D1 and the second signal line D2 are the signal lines D arranged adjacent to each other among the plural signal lines D composing the data bus YID, for example. The first signal line D1 and the second signal line D2 mutually implement capacitive coupling. The entire first signal line D1 is not necessarily arranged adjacent to the entire second signal line D2. The first signal line D1 and the second signal line D2 mutually implement the capacitive coupling when at least a part of the first signal line D1 and at least a part of the second signal line D2 are arranged adjacent to each other.

The first signal line D1 and the second signal line D2 are also collectively referred to below as "signal lines D". The first signal line D1 includes a first part D1*a* and a second part D1*b*. Similarly, the second signal line D2 includes a third part D2*a* and a fourth part D2*b*. The following is an explanation of the operation of the inverting repeater circuit 40 illustrated with the case of using the two signal lines for brevity. A capacitance between the signal lines due to the capacitive coupling is also referred to below as a "coupling capacitance".

The explanation is made below as an example of the readout operation. The following is an example in which the memory controller 1 toggles the signals /RE and RE, and the nonvolatile memory 2 transfers the read data synchronized with the signals /RE and RE as the signal DQ<7:0> to the memory controller 1. In the following example, a phrase "the signal is ON" is used when the signal is at the H level, and a phrase "the signal is OFF" is used when the signal is at the L level.

The inverting repeater circuit 40 operates in response to a first clock signal CLKA and a second clock signal CLKB. The first clock signal CLKA transitions between a first level (the H level, for example) and a second level (the L level, for example) different from the first level. The second clock signal CLKB transitions between a third level (the H level, for example) and a fourth level (the L level, for example) different from the third level. For example, the first level is higher than the second level, and the third level is higher than the fourth level. The first level may be lower than the second level, and the third level may be lower than the fourth level.

When the first clock signal CLKA is ON, a first signal DataA is input to the first part D1*a* of the first signal line D1. The inverting repeater circuit 40 outputs a signal obtained such that a logic of the first signal DataA is inverted (referred to below as "inverted signal") to the second part D1*b* of the first signal line D1. A first receiving circuit 61 connected to the first signal line D1 receives the inverted signal of the first signal DataA.

When the second clock signal CLKB is ON, a second signal DataB is input to the third part D2*a* of the second signal line D2. The inverting repeater circuit 40 outputs an inverted signal of the second signal DataB to the fourth part D2*b* of the second signal line D2. A second receiving circuit 62 connected to the second signal line D2 receives the inverted signal of the second signal DataB.

The inverting repeater circuit 40 is connected to the first receiving circuit 61 and the second receiving circuit 62. FIG. 5 illustrates a case in which the first receiving circuit 61 and the second receiving circuit 62 are each a flip-flop (FF). In this case, when the first clock signal CLKA is turned ON, the first receiving circuit 61 holds the inverted signal (the first inverted signal) of the first signal DataA. When the second clock signal CLKB is turned ON, the second receiving circuit holds the inverted signal (the second inverted signal) of the second signal DataB.

Figure 6:
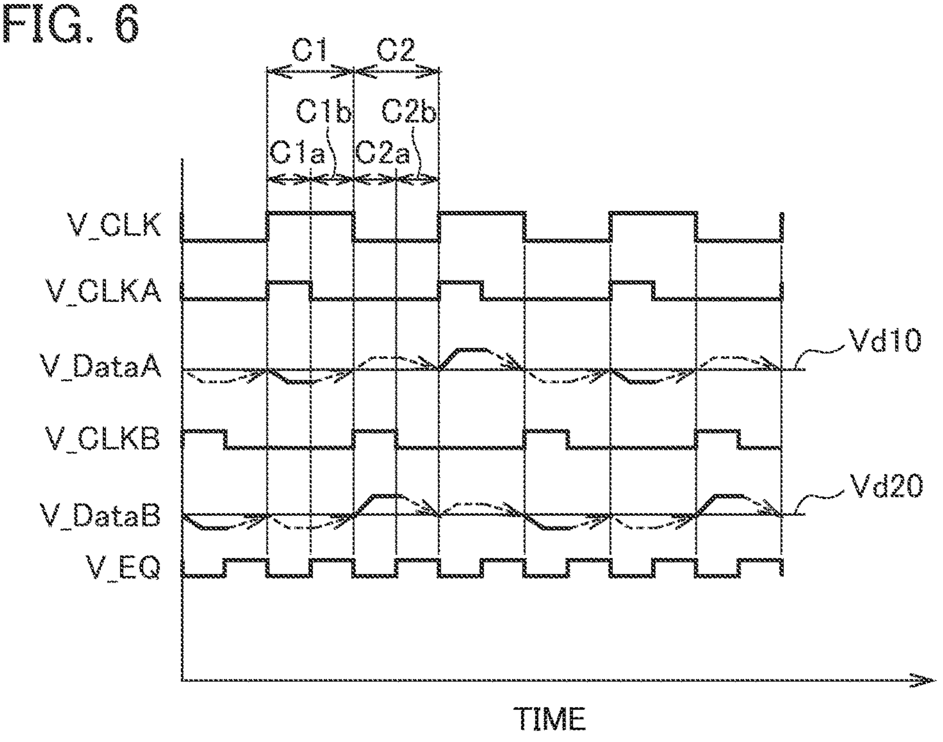
FIG. 6 is a timing chart showing an example of operation of the circuit illustrated in FIG. 5.

FIG. 6 is a timing chart showing an example of operation of the inverting repeater circuit 40. In FIG. 6, reference sign V_CLK refers to a potential of a reference clock signal CLK used for the operation of the nonvolatile memory 2. Reference sign V_CLKA refers to a potential of the first clock signal CLKA, and reference sign V_CLKB refers to a potential of the second clock signal CLKB. Reference sign V_DataA refers to a potential of the first signal line D1 (more particularly, a potential of the first part D1*a* of the first signal line D1), and reference sign V_DataB refers to a potential of the second signal line D2 (more particularly, a potential of the third part D2*a* of the second signal line D2). Reference sign V_EQ refers to a potential of the EQ signal. The signal names in the timing chart are the same as described above.

As shown in FIG. 6, a cycle of the first clock signal CLKA and a cycle of the second clock signal CLKB are the same as a cycle of the reference clock signal CLK.

A length of the ON period of each of the first clock signal CLKA and the second clock signal CLKB is half of a length of the ON period of the reference clock signal CLK. The timing at which the first clock signal CLKA is turned ON is shifted by half of the cycle of the reference clock signal CLK from the timing at which the second clock signal CLKB is turned ON.

As shown in FIG. 6, the period from which the first clock signal CLKA is turned ON to which the second clock signal CLKB is turned ON after the first clock signal CLKA is turned OFF is referred to below as a "first cycle C1". The period from which the second clock signal CLKB is turned ON to which the first clock signal CLKA is turned ON after the second clock signal CLKB is turned OFF is referred to below as a "second cycle C2". The first clock signal CLKA is OFF during the second cycle C2. The second clock signal CLKB is OFF during the first cycle C1. The first cycle C1 and the second cycle C2 are also collectively referred to below as "cycles". The first cycle C1 and the second cycle C2 are alternately repeated.

The first signal DataA is input to the first signal line D1 in response to the first clock signal CLKA in the first cycle C1. The second signal DataB is input to the second signal line D2 in response to the second clock signal CLKB in the second cycle C2. In particular, the first signal DataA is input to the first part D1*a* of the first signal line D1 in response to the first clock signal CLKA in the first cycle C1. The second signal DataB is input to the third part D2*a* of the second signal line D2 in response to the second clock signal CLKB in the second cycle C2.

The inverting repeater circuit 40 includes a first inverting repeater 411 arranged in the middle of the first signal line D1, and a second inverting repeater 412 arranged in the middle of the second signal line D2. In particular, the first inverting repeater 411 is arranged between the first part D1*a* and the second part D1*b* of the first signal line D1, and the second inverting repeater 412 is arranged between the third part D2*a* and the fourth part D2*b* of the second signal line D2. The first inverting repeater 411 and the second inverting repeater 412 are also collectively referred to below as "inverting repeaters 41" or simply as "inverters 41".

The first inverting repeater 411 (the first inverter 411) outputs, from an output terminal, an inverted signal of a signal received at an input terminal when the first clock signal CLKA is at the H level. The first inverting repeater 411 does not output the signal from the output terminal when the first clock signal CLKA is at the L level regardless of the potential level of the signal received at the input terminal. The first signal DataA input to the first signal line D1 is input to the first inverting repeater 411 in response to the falling edge of the first clock signal CLKA. The first inverting repeater 411 outputs the inverted signal of the first signal DataA to the first signal line D1, and the first receiving circuit 61 receives the inverted signal of the first signal DataA. In other words, the first inverting repeater 411 outputs the inverted signal of the first signal DataA input to the first part D1*a* of the first signal line D1 to the second part D1*b* of the first signal line D1.

The second inverting repeater 412 (the second inverter 412) outputs, from an output terminal, an inverted signal of a signal received at an input terminal when the second clock signal CLKB is at the H level. The second inverting repeater 412 does not output the signal from the output terminal when the second clock signal CLKB is at the L level regardless of the potential level of the signal received at the input terminal. The second signal DataB input to the second signal line D2 is input to the second inverting repeater 412 in response to the falling edge of the second clock signal CLKB. The second inverting repeater 412 outputs the inverted signal of the second signal DataB to the second signal line D2, and the second receiving circuit 62 receives the inverted signal of the second signal DataB. In other words, the second inverting repeater 412 outputs the inverted signal of the second signal DataB input to the third part D2*a* of the second signal line D2 to the fourth part D2*b* of the second signal line D2. The timing at which the second receiving circuit 62 receives the inverted signal of the second signal DataB is shifted by half of the cycle of the reference clock signal CLK from the timing at which the first receiving circuit 61 receives the inverted signal of the first signal DataA.

In the nonvolatile memory 2, the control circuit 50 illustrated in FIG. 4 generates the reference clock signal CLK based on the signal /RE and the signal RE received from the memory controller 1, and generates the first clock signal CLKA and the second clock signal CLKB in accordance with the generation of the reference clock signal CLK, for example. In a case in which a pulse generated at the rising edge of the reference clock signal is presumed to be the first clock signal CLKA, and a pulse generated at the falling edge of the reference clock signal CLK is presumed to be the second clock signal CLKB, for example, the controller 50 has a function as a frequency divider circuit for dividing the reference clock signal CLK, for example.

The nonvolatile memory 2 communicates with the memory controller 1 to transfer the data synchronized with the signals /RE and RE therebetween. The control circuit 50 may generate the first clock signal CLKA and the second clock signal CLKB by use of the signals /RE and RE, for example.

The control circuit 50 brings the second signal line D2 into a floating state in the first cycle (the first period) C1, and brings the first signal line D1 into a floating state in the second cycle (the second period) C2. The control circuit 50 brings both the first signal line D1 and the second signal line D2 into the floating state in a period in the first cycle C1 after the first clock signal CLKA is turned OFF and in a period in the second cycle C2 after the second clock signal CLKB is turned OFF.

The second signal line D2 is brought into the floating state in a period (a third period) C1*a* in the first cycle C1 in which the first clock signal CLKA is at the H level. The first signal line D1 and the second signal line D2 are both brought into the floating state in a period (a fourth period) C1*b* in the first cycle C1 in which the first clock signal CLKA is at the L level.

The first signal line D1 is brought into the floating state in a period (a fifth period) C2*a* in the second cycle C2 in which the second clock signal CLKB is at the H level. The first signal line D1 and the second signal line D2 are both brought into the floating state in a period (a sixth period) C2*b* in the second cycle C2 in which the second clock signal CLKB is at the L level.

The inverting repeater circuit 40 includes an equalizer circuit 42. The equalizer circuit 42 equalizes the potentials on the front and rear sides of the first inverting repeater 411 in the first signal line D1 in the floating state, and equalizes the potentials on the front and rear sides of the second inverting repeater 412 in the second signal line D2 in the floating state. The equalization of the potentials is referred to below as a "level adjustment". The equalizer circuit 42 executes the level adjustment when the first signal line D1 and the second signal line D2 are both in the floating state. With regard to the potentials on the front and rear sides of the first inverting repeater 411 and the potentials on the front and rear sides of the second inverting repeater 412, the phrase "potential on the front side" refers to a potential of the signal line D on the input side of the inverting repeater 41, and the phrase "potential on the rear side" refers to a potential of the signal line D on the output side of the inverting repeater 41 (the same is applied to the following explanations).

The potential of the signal line in the floating state typically tends to be fluctuated because of the influence by the capacitive coupling with the adjacent signal line. Namely, the potential of the first signal line D1 in the floating state is influenced by the potential of the second signal line D2. Similarly, the potential of the second signal line D2 in the floating state is influenced by the potential of the first signal line D1.

The influence on the signal line D in the floating state by the other signal line D via the capacitive coupling may increase the power supply current, increasing the power consumption of the circuit accordingly. The equalizer circuit 42 avoids or reduces the increase in the power consumption by the level adjustment, as described in detail below. The configuration and the operation of the equalizer circuit 42 are first described below.

As described above, the first signal DataA is input to the first signal line D1 in response to the first clock signal CLKA. The first clock signal CLKA is turned ON in the first half of the first cycle C1, and is turned OFF in the latter half of the first cycle C1. The first signal DataA is thus input to the first signal line D1 in the first half of the first cycle C1. The control circuit 50 brings the first signal line D1 into the floating state in the latter half of the first cycle C1. The equalizer circuit 42 executes the level adjustment for the first signal line D1 in the latter half of the first cycle C1.

The second signal DataB is input to the second signal line D2 in response to the second clock signal CLKB. The second clock signal CLKB is turned ON in the first half of the second cycle C2, and is turned OFF in the latter half of the second cycle C2. The second signal DataB is thus input to the second signal line D2 in the first half of the second cycle C2. The control circuit 50 brings the second signal line D2 into the floating state in the latter half of the second cycle C2. The equalizer circuit 42 executes the level adjustment for the second signal line D2 in the latter half of the second cycle C2.

The equalizer circuit 42 electrically connects the first part D1*a* and the second part D1*b* of the first signal line D1 to each other, and electrically connects the third part D2*a* and the fourth part D2*b* of the second signal line D2 to each other, when the first signal line D1 and the second signal line D2 are both in the floating state in the period (the fourth period) C1*b* in the first cycle C1 in which the first clock signal CLKA is at the L level. Similarly, the equalizer circuit 42 electrically connects the first part D1*a* and the second part D1*b* of the first signal line D1 to each other, and electrically connects the third part D2*a* and the fourth part D2*b* of the second signal line D2 to each other, when the first signal line D1 and the second signal line D2 are both in the floating state in the period (the sixth period) C2*b* in the second cycle C2 in which the second clock signal CLKB is at the L level.

The level adjustment made by the equalizer circuit 42 causes the potentials on the front and rear sides of the first inverting repeater 411 to conform to each other, and causes the potentials on the front and rear sides of the second inverting repeater 412 to conform to each other. The equalizer circuit 42 executes the level adjustment in the respective cycles so as to cause the potentials to conform to each other on the front and rear sides of the inverting repeaters 41 in the respective signal lines D in the floating state.

The equalizer circuit 42 includes a first equalizer 421 and a second equalizer 422, as illustrated in FIG. 5. The first equalizer 421 electrically connects the front and rear sides of the first inverting repeater 411 in the first signal line D1 upon the level adjustment made by the equalizer circuit 42. The second equalizer 422 electrically connects the front and rear sides of the second inverting repeater 412 in the second signal line D2 upon the level adjustment made by the equalizer circuit 42. The first equalizer 421 and the second equalizer 422 are also collectively referred to below as "equalizers 420".

The first equalizer 421 is connected to the first signal line D1 in parallel to the first inverting repeater 411. When the first equalizer 421 is in the ON state, the front and rear sides of the first inverting repeater 411 are electrically connected to each other in the first signal line D1. The ON state of the first equalizer 421 leads charges to move between the front and rear sides of the first inverting repeater 411. The movement of the charges neutralizes the charges held on the input side and the charges held on the output side of the first inverting repeater 411 in the first signal line D1. Causing a short circuit in the first signal line D1 on the front and rear sides of the first inverting repeater 411 via the first equalizer 421 leads the potentials of the first signal lines D1 to conform to each other on the front and rear sides of the first inverting repeater 411.

The second equalizer 422 is connected to the second signal line D2 in parallel to the second inverting repeater 412. When the second equalizer 422 is in the ON state, the front and rear sides of the second inverting repeater 412 are electrically connected to each other in the second signal line D2. The ON state of the second equalizer 422 leads charges to move between the front and rear sides of the second inverting repeater 412. The movement of the charges neutralizes the charges held on the input side and the charges held on the output side of the second inverting repeater 412 in the second signal line D2. Causing a short circuit in the second signal line D2 on the front and rear sides of the second inverting repeater 412 via the second equalizer 422 leads the potentials of the second signal lines D2 to conform to each other on the front and rear sides of the second inverting repeater 412.

The control circuit 50 controls the ON operation and the OFF operation of the equalizers 420 in accordance with the EQ signal and the /EQ signal that is inverted from the EQ signal. When the EQ signal is ON and the /EQ signal is OFF, the first equalizer 421 and the second equalizer 422 are brought into the ON operation, so as to short-circuit the front and rear sides of the first inverting repeater 411 in the first signal line D1, and short-circuit the front and rear sides of the second inverting repeater 412 in the second signal line D2. As shown in FIG. 6, the EQ signal is ON while the /EQ signal is OFF when the first clock signal CLKA and the second clock signal CLKB are both OFF.

The thick solid lines of the potential V_DataA and the potential V_DataB shown in FIG. 6 indicate the potentials of the respective signal lines D when the signals are input. The broken lines of the potential V_DataA and the potential V_DataB indicate the potentials of the respective signal lines D in the floating state having the influence via the capacitive coupling. The arrows in the potential V_DataA and the potential V_DataB indicate the change in the potentials of the respective signal lines D due to the level adjustment. In FIG. 6, a potential Vd10 corresponds to the potential V_DataA after the level adjustment is made, and a potential Vd20 corresponds to the potential V_DataB after the level adjustment is made.

As described above, the equalizer circuit 42 can electrically connect the first part D1*a* and the second part D1*b* of the first signal line D1 to each other, and can electrically connect the third part D2*a* and the fourth part D2*b* of the second signal line D2 to each other. The equalizers 420 are each a transfer gate composed of an n-type MOS transistor and a p-type MOS transistor, for example. The equalizers 420 may be implemented by a single transistor instead.

Figure 7:
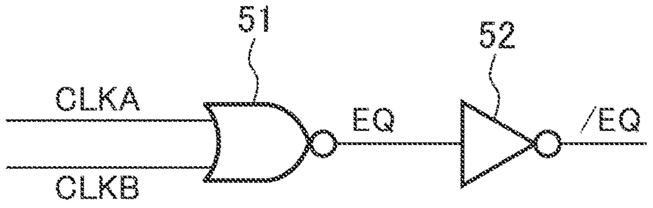
FIG. 7 is a circuit diagram that generates EQ signal and /EQ signal.

The EQ signal and the /EQ signal may be generated by a series connection of an exclusive OR circuit 51 and an inverter 52, as illustrated in FIG. 7, by use of the first clock signal CLKA and the second clock signal CLKB, for example. In particular, the control circuit 50 may generate the EQ signal as exclusive disjunction of the first clock signal CLKA and the second clock signal CLKB, and generate the /EQ signal by inverting a logical value of the EQ signal. The EQ signal and the /EQ signal are also collectively referred to below as "first control signals". The control circuit 50 thus may generate the first control signals by use of the first clock signal CLKA and the second clock signal CLKB, and control the equalizer circuit 42 by use of the first control signals.

The inverting repeater circuit 40 brings one of the two adjacent signal lines D into the floating state during a period when driving the other signal line D. This can reduce the influence by the capacitive coupling with respect to the other signal line D adjacent thereto. The inverting repeater circuit 40 also avoids or reduces the increase in the power consumption due to the level adjustment made by the equalizer circuit 42.

The decrease in the power consumption due to the level adjustment made by the equalizer circuit 42 is described below. While the embodiment is illustrated above with the case of using the two signal lines D to which the inverting repeaters 41 are connected, the number of the signal lines D to which the inverting repeaters 41 are connected can be determined as appropriate. The following is an explanation of the operation of the inverting repeater circuit 40 illustrated with the case of using three signal lines D to which the inverting repeaters 41 are connected, with reference to FIG. 8.

Figure 8:
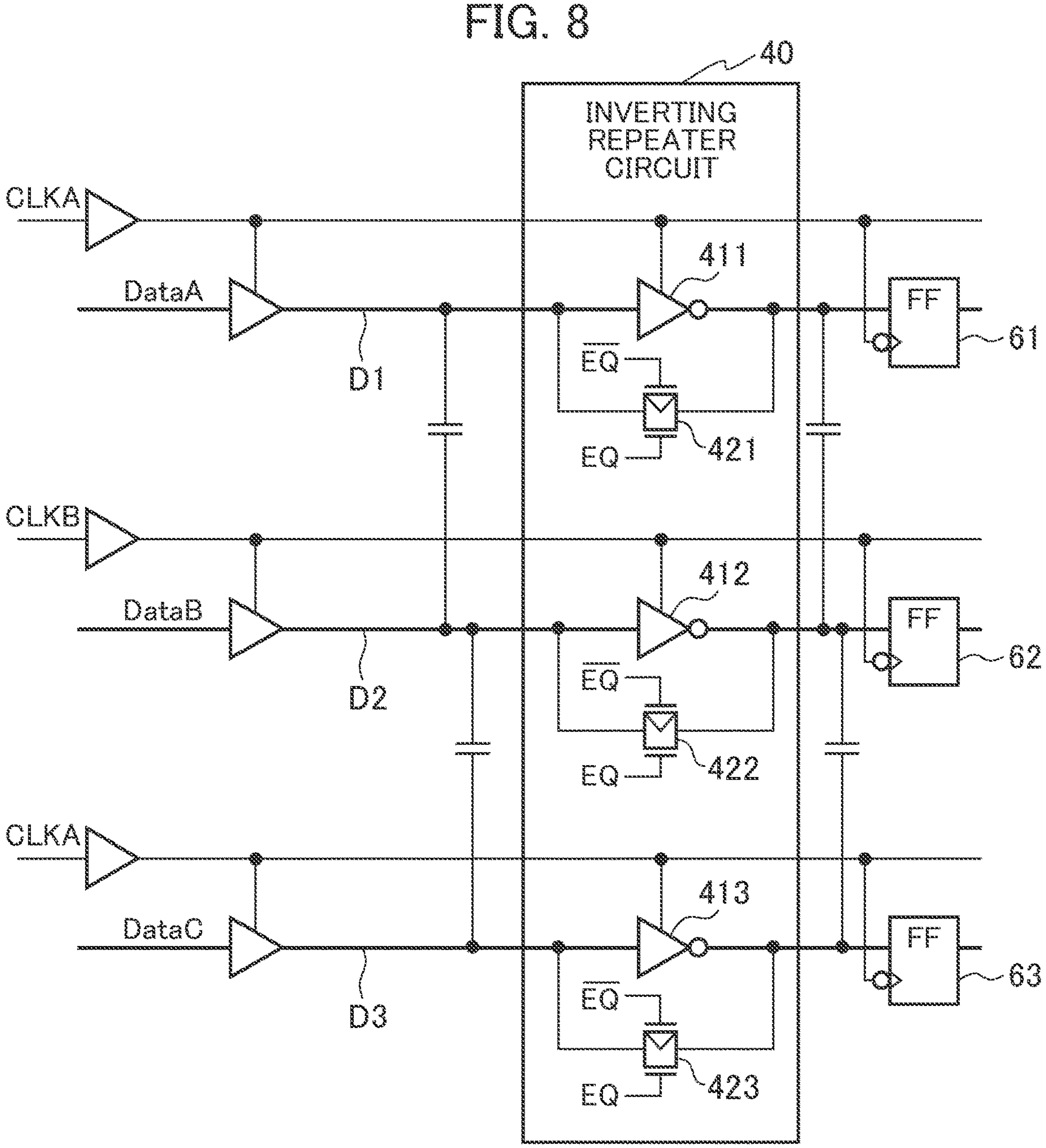
FIG. 8 is a circuit diagram showing a second example of the inverting repeater circuit according to the embodiment.

FIG. 8 is a circuit diagram of the inverting repeater circuit 40 according to the embodiment. The inverting repeater circuit 40 according to the embodiment is connected to at least the first signal line D1, the second signal line D2 and a third signal line D3 arranged adjacent to each other. The first signal line D1 and the second signal line D2 mutually implement the capacitive coupling, and the second signal line D2 and the third signal line D3 mutually implement the capacitive coupling.

The inverting repeater circuit 40 illustrated in FIG. 8 differs from the inverting repeater circuit 40 illustrated in FIG. 5 in further including the third signal line D3, a third inverting repeater 413, a third equalizer 423, and a third receiving circuit 63.

When the first clock signal CLKA is ON, a third signal DataC is input to the third signal line D3. The third inverting repeater 413 arranged in the middle of the third signal line D3 outputs, to the third signal line D3, an inverted signal obtained such that a logic of the third signal DataC is inverted. The third equalizer 423 electrically connects the front and rear sides of the third inverting repeater 413 in the third signal line D3 by the level adjustment. The third receiving circuit 63 receives the inverted signal of the third signal DataC when the first clock signal CLKA is at the H level.

In response to the first clock signal CLKA, the signals are transmitted through the first signal line D1 and the third signal line D3. In response to the second clock signal CLKB, the signal is transmitted through the second signal line D2.

Figure 9:
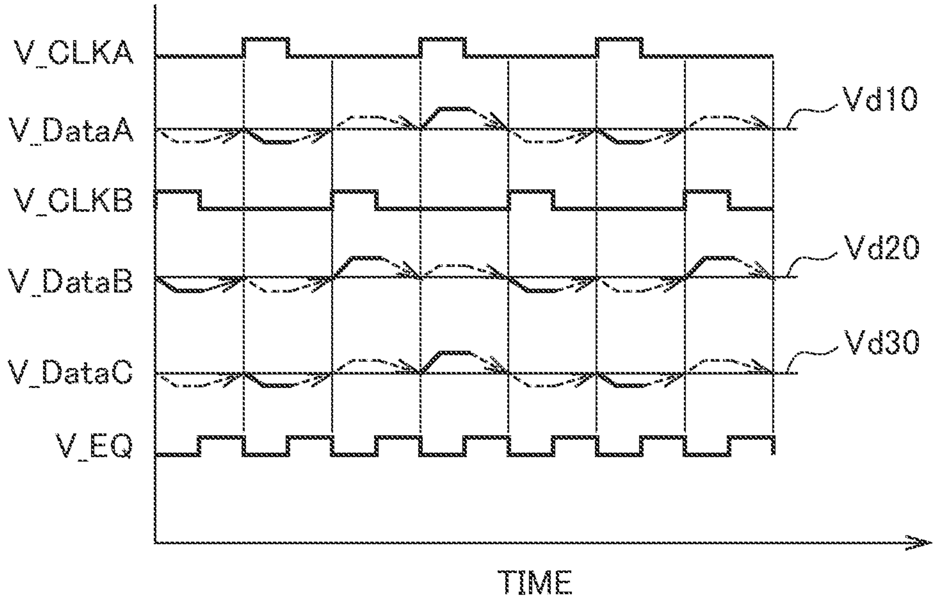
FIG. 9 is a timing chart showing an example of operation of the circuit illustrated in FIG. 8.

FIG. 9 is a diagram showing the potentials of the clock signals, the potentials of the signal lines D, and the potential of the EQ signal. In FIG. 9, reference sign V_DataC refers to the potential of the third signal line D3. A potential Vd30 corresponds to the potential V_DataC after the level adjustment is made.

FIG. 5 shows the first signal line D1 and the second signal line D2. FIG. 8 shows the first signal line D1, the second signal line D2, and the third signal line D3. The relation between the first signal line D1 and the second signal line D2 corresponds to the relation between the third signal line D3 and the second signal line D2. In the configuration in which the first signal line D1 and the third signal line D3 are arranged to interpose the second signal line D2, as illustrated in FIG. 8, the potential of the second signal line D2 arranged in the middle is influenced by the change in the potentials of the adjacent signal lines D located on both sides.

Figure 10:
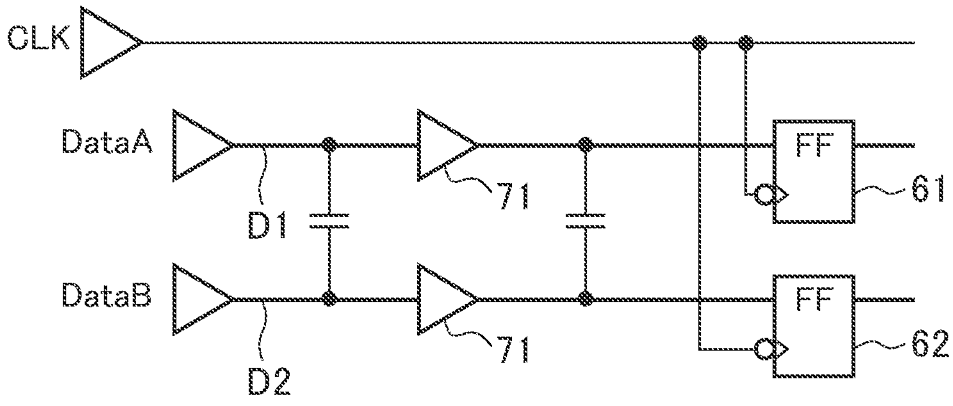
FIG. 10 is a schematic diagram of a repeater circuit of a first comparative example.

FIG. 10 is a diagram showing a repeater circuit of a first comparative example not including the inverting repeater circuit 40. The comparison is described below between the operation of the inverting repeater circuit 40 according to the embodiment as illustrated in FIG. 8 and the operation of the repeater circuit of the first comparative example as illustrated in FIG. 10.

FIG. 10 shows the first signal line D1 to which the first signal DataA is input, and the second signal line D2 to which the second signal DataB is input. The first signal DataA is received by the first receiving circuit 61, and the second signal DataB is received by the second receiving circuit 62. The first comparative example uses normal buffers 71 for relaying the signals between the respective signal lines D. The term "normal buffer" as used herein refers to a buffer circuit that does not invert a logical value of a signal.

Figure 11:
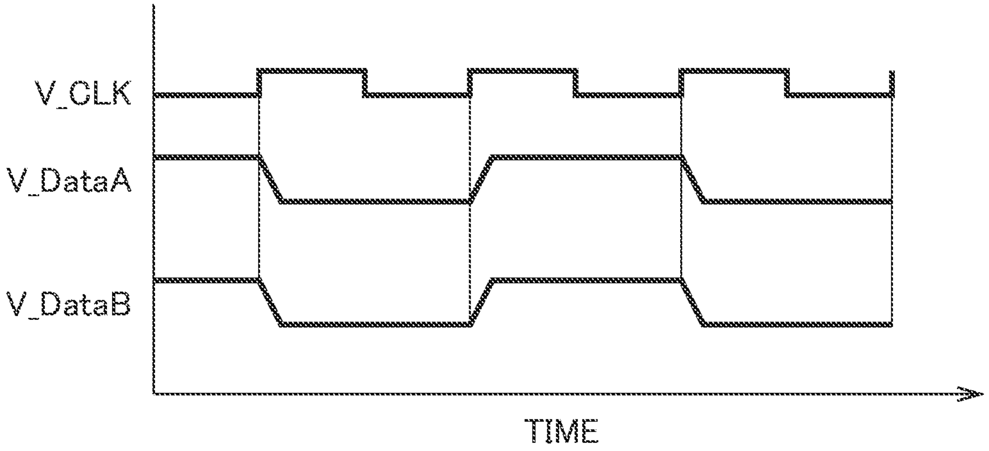
FIG. 11 is a timing chart showing an example of operation of the circuit illustrated in FIG. 10.

FIG. 11 is a timing chart showing an example of operation of the circuit illustrated in FIG. 10. In FIG. 11, reference sign V_CLK is the potential of the reference clock signal CLK, reference sign V_DataA is the potential of the first signal line D1, and reference sign V_DataB is the potential of the second signal line D2. The first signal DataA is input to the first signal line D1 in response to the rising edge of the reference clock signal CLK. The second signal DataB is input to the second signal line D2 in response to the rising edge of the reference clock signal CLK. Namely, the timing at which the first signal DataA is sent and the timing at which the second signal DataB is sent conform to each other.

Figure 12:
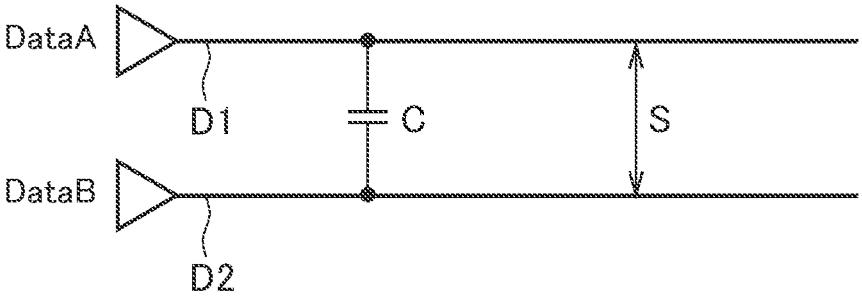
FIG. 12 is a schematic diagram showing an arrangement of signal lines of the first comparative example.

FIG. 12 is a diagram showing an arrangement of the signal lines D in the first comparative example. A gap between the first signal line D1 and the second signal line D2 is denoted by sign S, and a coupling capacitance between the first signal line D1 and the second signal line D2 is denoted by sign C. The gap S may be a minimum pitch d according to design rules of the circuit, for example.

Figure 13:
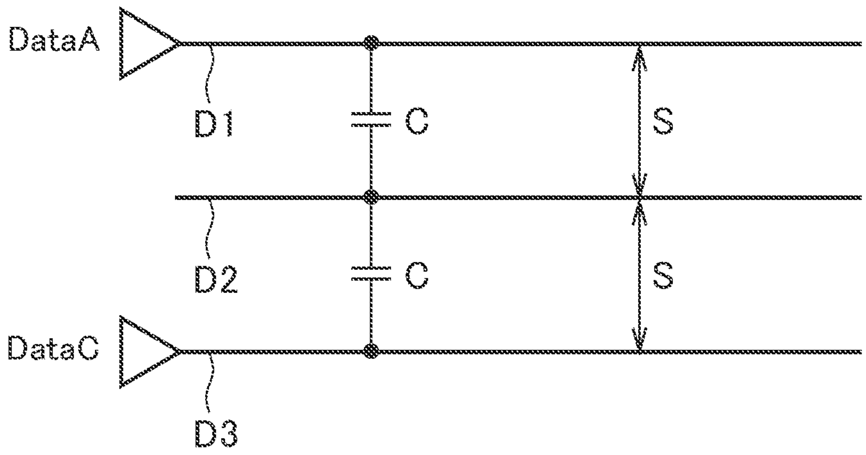
FIG. 13 is a schematic diagram showing an arrangement of signal lines of a data bus according to the embodiment.

FIG. 13 is a diagram showing an arrangement of the signal lines D connected to the inverting repeater circuit 40 according to the embodiment illustrated in FIG. 8. A gap between the first signal line D1 and the second signal line D2 is denoted by sign S, and a coupling capacitance between the first signal line D1 and the second signal line D2 is denoted by sign C. Similarly, a gap between the second signal line D2 and the third signal line D3 is denoted by sign S, and a coupling capacitance between the second signal line D2 and the third signal line D3 is denoted by sign C. The first signal DataA is input to the first signal line D1, and the third signal DataC is input to the third signal line D3. The second signal line D2 is in the floating state.

Figure 14:
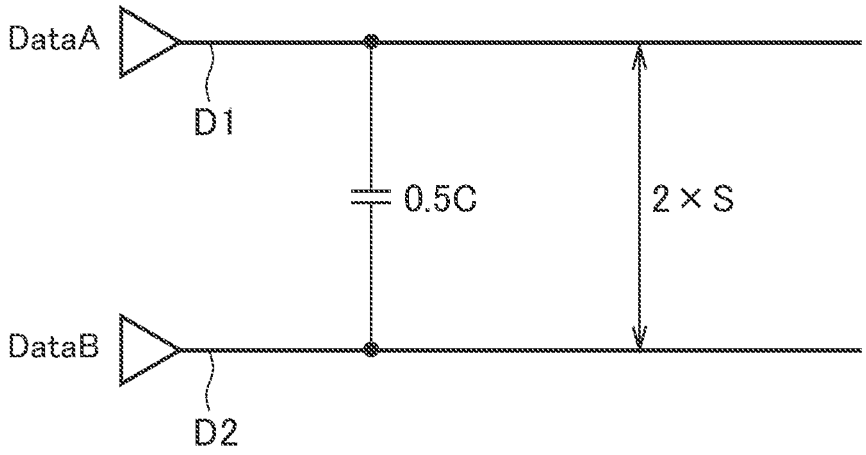
FIG. 14 is a schematic diagram showing an arrangement of signal lines of a second comparative example.

FIG. 14 is a diagram showing an arrangement of signal lines D in a second comparative example. The second comparative example uses the arrangement in which a gap between the first signal line D1 and the second signal line D2 is increased by 2×S on the basis of the first comparative example. A coupling capacitance between the first signal line D1 and the second signal line D2 is 0.5×C.

FIG. 15 is a table showing an example of the power supply currents in the arrangement of the signal lines D in the first comparative example illustrated in FIG. 12, an example of the power supply currents in the arrangement of the signal lines D according to the embodiment illustrated in FIG. 13, and an example of the power supply currents in the arrangement of the signal lines D in the second comparative example illustrated in FIG. 14. FIG. 15 shows a value of the power supply current Ivcc flowing through the power supply line of the power supply voltage Vcc and a value of the power supply current Ivss flowing through the power supply line of the ground voltage Vss in each of case 1 to case 4 classified in accordance with the change in the potential of the respective signal lines D. The table relatively indicates a level of the power supply currents for each of the first comparative example, the embodiment, and the second comparative example.

Case 1 is an example in which the respective potentials are changed in the opposite directions in the two signal lines arranged closest to each other among the signal lines through which the data is transmitted. In particular, the first comparative example and the second comparative example in case 1 each show the potential V_DataA of the first signal line D1 that is changed from the H level to the L level, and the potential V_DataB of the second signal line D2 that is changed from the L level to the H level. The embodiment shows the potential V_DataA that is changed from the H level to the L level, and the potential V_DataC that is changed from the L level to the H level. The potential V_DataB of the second signal line in the floating state in the embodiment is not changed in case 1. FIG. 15 indicates the potential V_DataB of the second signal line D2 in the floating state in the embodiment by the broken line (the same is also applied to case 2 to case 4).

Case 2 is an example in which the respective potentials are changed in the same direction in the two signal lines arranged closest to each other among the signal lines through which the data is transmitted. In particular, the first comparative example and the second comparative example in case 2 each show the potential V_DataA and the potential V_DataB that are changed from the H level to the L level. The embodiment shows the potential V_DataA and the potential V_DataC that are changed from the H level to the L level. The potential V_DataB of the second signal line D2 in the embodiment in case 2 is changed from the H level to the L level.

Case 3 is an example in which the potential is changed in one of the two signal lines arranged closest to each other among the signal lines through which the data is transmitted, and the both signal lines thus have the same potential. In particular, the first comparative example and the second comparative example in case 3 each show the potential V_DataA that is changed from the H level to the L level, and the potential V_DataB that is constant at the L level. The embodiment shows the potential V_DataA that is changed from the H level to the L level, and the potential V_DataC that is constant at the L level. The potential V_DataB of the second signal line D2 in the embodiment in case 3 is changed from the H level to the L level. The change of the potential V_DataB in the embodiment is smaller than the change of the potential of the other signal lines D. The reason for this is that the influence by the capacitive coupling between the signal lines D is decreased due to the level adjustment made by the equalizer circuit 42. The decrease of the influence by the capacitive coupling due to the level adjustment is described in detail below.

Case 4 is an example in which the potential is changed in one of the two signal lines arranged closest to each other among the signal lines through which the data is transmitted, and the respective signal lines thus have the different potentials. The first comparative example and the second comparative example in case 4 each show the potential V_DataA that is changed from the H level to the L level, and the potential V_DataB that is constant at the H level. The embodiment shows the potential V_DataA that is changed from the H level to the L level, and the potential V_DataC that is constant at the H level. The potential V_DataB of the second signal line D2 in the embodiment in case 4 is changed from the H level to the L level. The change of the potential V_DataB is small due to the level adjustment made by the equalizer circuit 42.

With regard to the comparison between the first comparative example and the embodiment in FIG. 15, the power supply current Ivcc and the power supply current Ivss in case 1 each show "2" in the first comparative example, but each show "1" in the embodiment. The power supply current Ivcc and the power supply current Ivss in case 3 and case 4 each show "1" in the first comparative example, but each show "0.5" in the embodiment. The power supply currents are thus smaller in the embodiment than in the first comparative example. The reason for this is that the influence by the capacitive coupling in the embodiment is substantially half of that in the first comparative example. The reason the influence by the capacitive coupling between the signal lines D is smaller when the inverting repeater circuit 40 according to the embodiment is used is that the second signal line D2 arranged between the first signal line D1 and the third signal line D3 is in the floating state.

The use of the configuration in the second comparative example can reduce the power supply currents as compared with the configuration of the first comparative example. As shown in FIG. 15, the power supply current Ivcc and the power supply current Ivss each show "2" in the first comparative example, but each show "1" in the second comparative example. The power supply current Ivcc and the power supply current Ivss in case 3 and case 4 each show "1" in the first comparative example, but each show "0.5" in the second comparative example. The reason the influence by the capacitive coupling between the signal lines D is smaller in the second comparative example is that the gap between the first signal line D1 and the second signal line D2 is wider than that in the first comparative example. The configuration in the second comparative example, however, inevitably increases the circuit area in order to increase the gap between the respective signal lines D. The configuration according to the embodiment has substantially the same power supply currents as the second comparative example, while the gap between the respective signal lines is half of that in the configuration in the second comparative example. The use of the inverting repeater circuit 40 according to the embodiment thus can avoid or reduce the increase in the circuit area, and can decrease the power supply current.

The potential of the signal line D in the floating state tends to be fluctuated because of the influence by the capacitive coupling with the adjacent signal line D. For example, the potential of the second signal line D2 in the floating state is fluctuated by the influence of the change in the potentials of the first signal line D1 and the third signal line D3.

Figure 16:
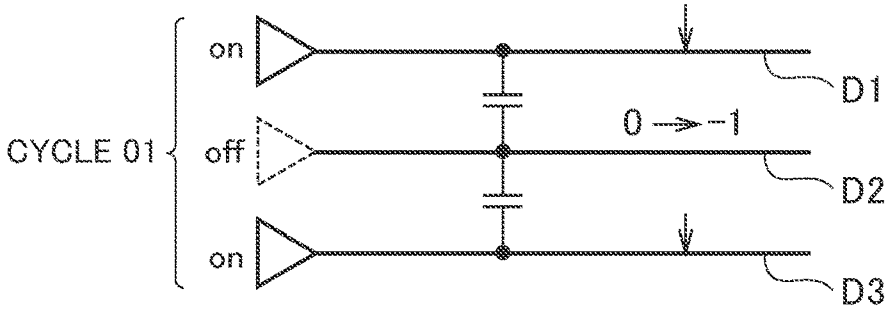
FIG. 16 is a schematic diagram for explaining a change in potential of the signal lines (cycle 01).
Figure 17:
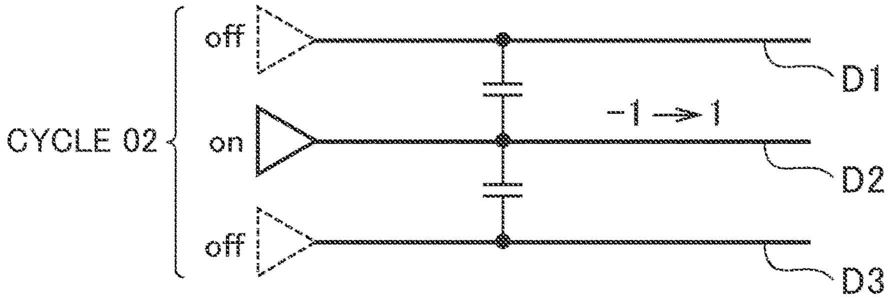
FIG. 17 is a schematic diagram for explaining a change in potential of the signal lines (cycle 02).

A case is described below in which the potentials of the signal lines D are changed from a state in cycle illustrated in FIG. 16 to a state in cycle 02 illustrated in FIG. 17. FIG. 16 and FIG. 17 each illustrate the signal lines D in which the potentials are changed, which are indicated by "on", and illustrate the signal lines D in the floating state, which are indicated by "off". The arrows shown in FIG. 16 and FIG. 17 indicate the direction in which the potentials of the signal lines D are changed. In particular, the downward arrow in the drawings indicates the change of the potential from the H level to the L level, and the upward arrow in the drawings indicates the change of the potential from the L level to the H level. These illustrations are also applied to the other drawings described below.

In cycle 01, when the potentials of the first signal line D1 and the third signal line D3 are changed from the H level to the L level, the potential of the second signal line D2 in the floating state is decreased due to the influence by the capacitive coupling. The potential of the second signal line D2 in the floating state in the case of not being influenced by the adjacent signal lines D is indicated by "0", and the potential of the second signal line D2 in the floating state in the case of being decreased due to the influence by the capacitive coupling is indicated by "−1". In cycle 01, bringing the second signal line D2 into the floating state can decrease the power supply current, as described above.

In cycle 02 after cycle 01, the first signal line D1 and the third signal line D3 are brought into the floating state, while the potential of the second signal line D2 is set to "1" at the H level. When the potential of the second signal line D2 is "0" in cycle 01, the potential of the second signal line D2 only needs to be increased by "1". If the potential of the second signal line D2 is decreased to "−1" in cycle 01, the potential of the second signal line D2 needs to be increased by “2” so as to be brought into “1”. Bringing the second signal line D2 into the floating state in cycle 01 can decrease the power supply current in cycle 01, but increases the power supply current in cycle 02.

As described above, the power consumption may be increased depending on the initial state of the signal line D, namely, depending on the operation in the previous cycle when the potential of the corresponding signal line D changed during the floating state is intended to be set to the H level or the L level in the subsequent cycle.

In contrast, the inverting repeater circuit 40 including the equalizer circuit 42 initializes the change in the potential caused via the capacitive coupling during the period when the signal line D is in the floating state. The inverting repeater circuit 40 thus can avoid or reduced the increase in the power supply current in the subsequent cycle. The operation of the equalizer circuit 42 is described in detail below with reference to FIG. 18 to FIG. 20.

Figure 18:
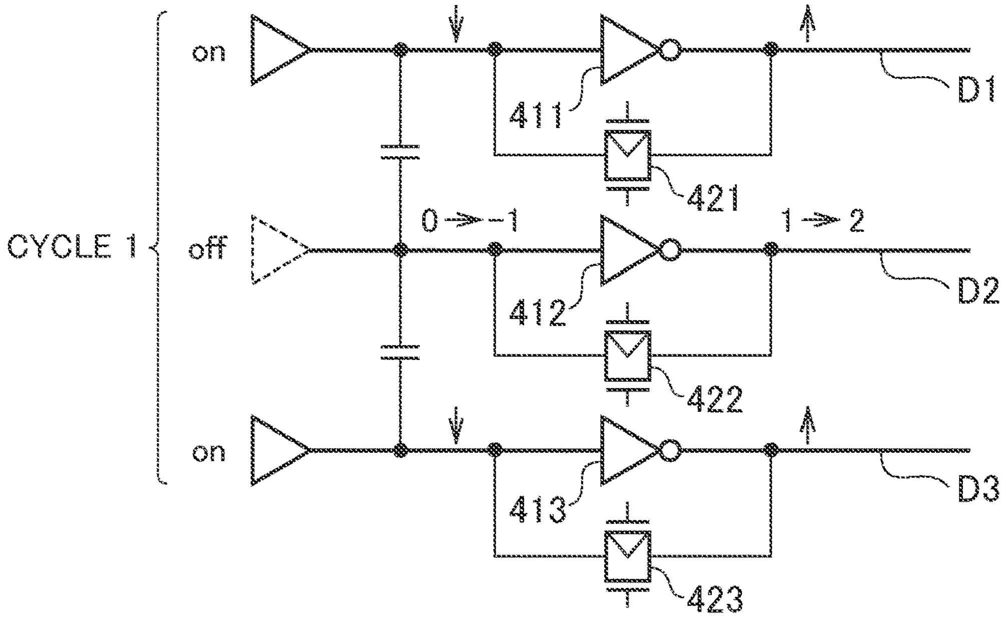
FIG. 18 is a schematic diagram for explaining a change in potential of the signal lines due to an equalizer circuit (cycle 1).

In cycle 1 illustrated in FIG. 18, the potentials of the first signal line D1 and the second signal line D3 are changed from the H level to the L level. The potential of the second signal line D2 in this case is decreased from “0” to “−1” on the input side of the second inverting repeater 412, and is increased from “1” to “2” on the output side of the second inverting repeater 412. The first equalizer 421, the second equalizer 422, and the third equalizer 423 are in the OFF state in cycle 1.

Figure 19:
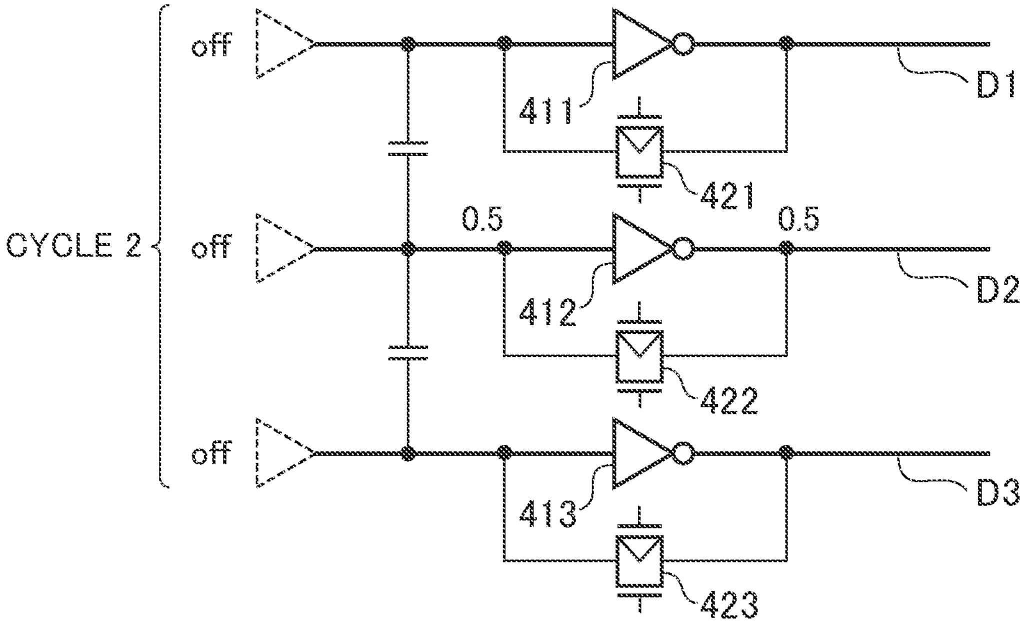
FIG. 19 is a schematic diagram for explaining a change in potential of the signal lines due to the equalizer circuit (cycle 2).

In cycle 2 illustrated in FIG. 19, the first signal line D1, the second signal line D2, and the third signal line D3 are brought into the floating state so as to execute the level adjustment by the equalizer circuit 42. Namely, the first equalizer 421, the second equalizer 422, and the third equalizer 423 are brought into the ON state. Bringing the second equalizer 422 into the ON state causes the potentials of the second signal line D2 on the front and rear sides of the second inverting repeater 412 to conform to each other at “0.5”.

Figure 20:
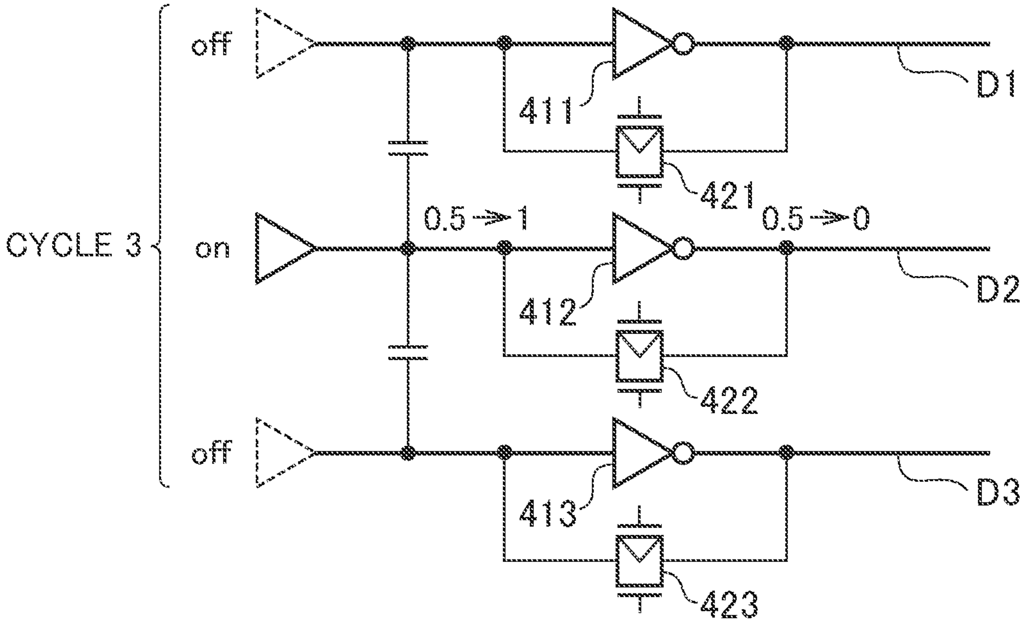
FIG. 20 is a schematic diagram for explaining a change in potential of the signal lines due to the equalizer circuit (cycle 3).

Next, in cycle 3 illustrated in FIG. 20, the potential of the second signal line D2 is set to be the H level while the first signal line D1 and the third signal line D3 are kept in the floating state. The potential of the second signal line D2 is increased from “0.5” to “1” on the input side of the second inverting repeater 412, and is decreased from “0.5” to “0” on the output side of the second inverting repeater 412. The circuit including the equalizer circuit 42 thus can reduce a degree of the potential to be changed in the second signal line D2.

The level adjustment by the equalizer circuit 42 is also executed after cycle 3. In particular, the first equalizer 421 connected to the first signal line D1 and the third equalizer 423 connected to the third signal line D3 are brought into the ON state. This causes the potentials of the first signal line D1 to conform to each other on the front and rear sides of the first inverting repeater 411, and causes the potentials of the third signal line D3 to conform to each other on the front and rear sides of the third inverting repeater 413. The potential conformation can reduce the fluctuation in the potentials of the first signal line D1 and the third signal line D3 derived from the change in the potential of the second signal line D2. The degree of the potentials to be changed in the first signal line D1 and the third signal line D3 thus can be reduced accordingly.

The level adjustment made by the equalizer circuit 42 described above equalizes the charges accumulated in the signal line D in each of the first half and the latter half of the inverting repeater 41 due to the capacitive coupling with the other signal line D. This can avoid or reduce the increase in the power supply current in the subsequent cycle due to the influence by the charges accumulated in the period (the previous cycle) in which the signal line D is in the floating state.

As described above, the inverting repeater circuit 40 brings one of the two signal lines D adjacent to each other into the floating state, so as to reduce the influence by the capacitive coupling. This can decrease the power supply current without causing an increase in the area of the semiconductor integrated circuit.

The equalizer circuit 42 executes the level adjustment so as to equalize the potentials on the front and rear sides of the inverting repeater 41 before the signal is input regarding the signal line D in the floating state. The plus charges and the minus charges accumulated in the signal line D in the floating state are thus offset in each cycle. The offset of the charges avoids or reduces the influence, caused by the fluctuation in the potential in the signal line D during the floating state, on the signal line D in the subsequent cycle in which the signal is input. This can avoid the increase in the power supply current accordingly.

The semiconductor integrated circuit according to the embodiment as described above can avoid the increase in the power supply current in all cycles so as to decrease the power consumption of the semiconductor integrated circuit without causing an increase in the area of the semiconductor integrated circuit.

As illustrated in FIG. 6, the cycle of the EQ signal for controlling the operation of the equalizers 420 is half of the cycle of the reference clock signal CLK. The operating speed of the input-output circuit 22 is set to be slower than the operating speed of the sense amplifier 31 that reads the data from the memory cell array 21 of the nonvolatile memory 2 (the transmission speed of the control signal in the control signal line of the sense amplifier 31). The cycle of the operation of the input-output circuit 22 is about 100 MHz, for example. The inverting repeater circuit 40 thus can operate stably regardless of the cycle of the EQ signal that is half of the cycle of the reference clock signal CLK. The inverting repeater circuit 40 may be arranged in the signal line that has a relatively slow speed of the signal transmission among the signal lines in the semiconductor integrated circuit.

The potentials on the front and rear sides of the inverting repeater 41 in the signal line D in the floating state can conform to each other by the level adjustment more easily as a level of a parasitic capacitance in the signal line D is closer on the input side and the output side of the inverting repeater 41. The level of the parasitic capacitance of the first signal line D1 is preferably substantially equal to each other on the front and rear sides of the first inverting repeater 411, and the level of the parasitic capacitance of the second signal line D2 is preferably substantially equal to each other on the front and rear sides of the second inverting repeater 412. In other words, the wire length of the first part D1*a* and the wire length of the second part D1*b* of the first signal line D1 are preferably substantially equal to each other on the assumption that the parasitic capacitance per unit length of the wire is substantially constant. In addition, the wire length of the third part D2*a* and the wire length of the fourth part D2*b* of the second signal line D2 are preferably substantially equal to each other. For example, the inverting repeater 41 is arranged around the middle of the entire length of the signal line D when the level of the parasitic capacitance of the signal line D is substantially constant in the entire length of the signal line D.

MODIFIED EXAMPLE

FIG. 8 illustrates the inverting repeater circuit according to the embodiment with the case in which the signals are transmitted through the signal lines D in one direction. Alternatively, the inverting repeater circuit 40 may be arranged in the signal lines D through which the signals are transmitted in the both directions. The arrangement of the inverting repeater circuit 40 in the signal lines D through which the signals are transmitted in the both directions can also avoid the increase in the power supply current and decrease the power consumption of the semiconductor integrated circuit.

For example, the inverting repeater circuit 40 can avoid the increase in the power supply current in a case in which the signals are transmitted in the both directions in the data bus YIO of the nonvolatile memory 2. A case in which the signal is transmitted from the input-output circuit 22 to the sense amplifier 31 is referred to below as "data-in". A case in which the signal is transmitted from the sense amplifier 31 to the input-output circuit 22 is referred to below as "data-out".

Figure 21:
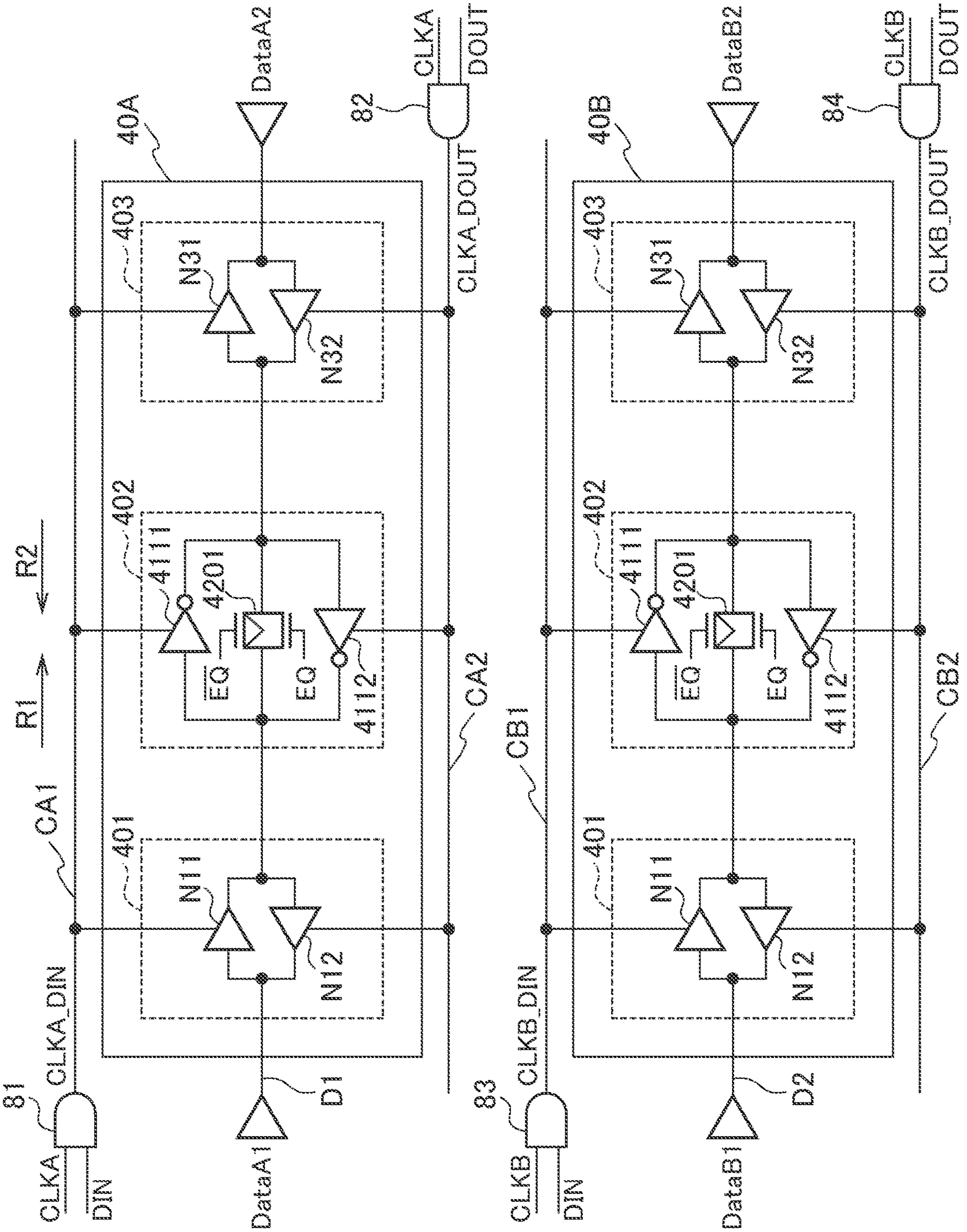
FIG. 21 is a schematic diagram for explaining an operation of a semiconductor integrated circuit according to a modified example of the embodiment.

FIG. 21 is a diagram illustrating a configuration of inverting repeater circuits 40A and 40B according to a modified example of the embodiment. The inverting repeater circuits 40A and 40B according to the modified example transmit the signals in the both directions through the respective signal lines D. The direction from left to right in the sheet of FIG. 21 is defined as a "first direction R1", and the direction from right to left is defined as a "second direction R2". For example, the first direction R1 is the advancing direction of the signal in the case of the data-in, and the second direction R2 is the advancing direction of the signal in the case of the data-out.

In the configuration according to the modified example illustrated in FIG. 21, a signal DataA1 advances in the first direction R1 in the first signal line D1, and a signal DataA2 advances in the second direction R2 in the first signal line D1. A signal DataB1 advances in the first direction R1 in the second signal line D2, and a signal DataB2 advances in the second direction R2 in the second signal line D2.

In the configuration according to the modified example, the inverting repeater circuit 40 including a first circuit 401, a second circuit 402, and a third circuit 403 connected in series is arranged in each of the first signal line D1 and the second signal line D2. FIG. 21 indicates the inverting repeater circuit 40 arranged in the middle of the first signal line D1 as a first inverting repeater circuit 40A, and indicates the inverting repeater circuit 40 arranged in the middle of the second signal line D2 as a second inverting repeater circuit 40B.

The first circuit 401 has a configuration in which a normal buffer N11 in which the signal is transmitted in the first direction R1 and a normal buffer N12 in which the signal is transmitted in the second direction R2 are connected antiparallel to each other. The second circuit 402 has a configuration in which an inverting repeater 4111 in which the signal is transmitted in the first direction R1, an inverting repeater 4112 in which the signal is transmitted in the second direction R2, and an equalizer 4201 are connected in parallel. The third circuit 403 has a configuration in which a normal buffer N31 in which the signal is transmitted in the first direction R1 and a normal buffer N32 in which the signal is transmitted in the second direction R2 are connected antiparallel to each other.

The signal DataA1 advances in the first direction R1 in the first inverting repeater circuit 40A in response to a clock signal CLKA_DIN transmitted through a first clock line CA1. The signal DataA2 advances in the second direction R2 in the first inverting repeater circuit 40A in response to a clock signal CLKA_DOUT transmitted through a second clock line CA2. The signal DataB1 advances in the first direction R1 in the second inverting repeater circuit 40B in response to a clock signal CLKB_DIN transmitted through a third clock line CB1. The signal DataB2 advances in the second direction R2 in the second inverting repeater circuit 40B in response to a clock signal CLKB_DOUT transmitted through a fourth clock line CB2.

The clock signal CLKA_DIN is generated by a first AND circuit 81 as a logical product of the first clock signal CLKA and the signal DIN. The clock signal CLKA_DOUT is generated by a second AND circuit 82 as a logical product of the first clock signal CLKA and the signal DOUT. The clock signal CLKB_DIN is generated by a third AND circuit 83 as a logical product of the second clock signal CLKB and the signal DIN. The clock signal CLKB_DOUT is generated by a fourth AND circuit 84 as a logical product of the second clock signal CLKB and the signal DOUT.

When the signal advances in the first direction R1 to be transmitted through the signal line D, the control circuit 50 brings the signal DIN into the H level and brings the signal DOUT into the L level. When the signal advances in the second direction R2 to be transmitted through the signal line D, the control circuit 50 brings the signal DIN into the L level and brings the signal DOUT into the H level. The configuration according to the modified example thus causes the signals to be transmitted in the both directions through the signal lines D. The timing at which the first clock signal CLKA is turned ON is shifted from the timing at which the second clock signal CLKB is turned ON by half of the cycle of the reference clock signal CLK. This can shift the timing at which the potential of the first signal line D1 is changed from the timing at which the potential of the second signal line D2 is changed by half of the cycle of the reference clock signal CLK.

In the case of the data-out, the control circuit 50 may generate the control signal for controlling the inverting repeater circuit 40 by use of the signals /RE and RE, as described above. In the case of the data-in, the control circuit 50 may generate the signal DIN and the signal DOUT that are the control signals for controlling the inverting repeater circuit 40 based on the signals DQS and /DQS.

Other Embodiments

While the above embodiment has been illustrated with the case in which the nonvolatile memory 2 is a NAND flash memory, the nonvolatile memory 2 may be a memory device of any other type. The embodiment of the present invention may be applied to a semiconductor integrated circuit other than the nonvolatile memory.

While certain embodiments have been described, these embodiments have been presented by way of example only, and are not intended to limit the scope of the inventions. Indeed, the novel embodiments described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:

a first signal line including a first part which a first signal is input in response to a first clock signal in a first period, and a second part;

a second signal line including a third part to which a second signal is input in response to a second clock signal in a second period after the first period, and a fourth part;

a first inverter arranged between the first part and the second part of the first signal line, and configured to receive the first signal from the first part and output a first inverted signal obtained by inverting a logic level of the first signal to the second part;

a second inverter arranged between the third part and the fourth part of the second signal line, and configured to receive the second signal from the third part and output a second inverted signal obtained by inverting a logic level of the second signal to the fourth part; and a control circuit configured to bring the second signal line into a floating state in the first period, and bring the first signal line into a floating state in the second period, wherein the first clock signal transitions between a first level and a second level different from the first level;

the second clock signal transitions between a third level and a fourth level different from the third level;

the first clock signal is brought into the first level and the second clock signal s brought into the fourth level in a third period as a part of the first period;

the first clock signal is brought into the second level and the second clock signal is brought into the fourth level in a fourth period as another part of the first period;

the first clock signal is brought into the second level and the second clock signal is brought into the third level in a fifth period as a part of the second period; and the first clock signal is brought into the second level and the second clock signal is brought into the fourth level in a sixth period as another part of the second period.

2. The semiconductor integrated circuit according to claim 1, wherein:

the first level is higher than the second level; and the third level is higher than the fourth level.

3. The semiconductor integrated circuit according to claim wherein the control circuit generates the first clock signal and the second clock signal from a reference clock signal.

4. The semiconductor integrated circuit according to claim 3, further comprising an equalizer circuit configured to electrically connect the first part and the second part of the first signal line to each other, and electrically connect the third part and the fourth part of the second signal line to each other.

5. The semiconductor integrated circuit according to claim 4, wherein the equalizer circuit includes:

a first equalizer configured to electrically connect the first part and the second part to each other; and a second equalizer configured to electrically connect the third part and the fourth part to each other.

6. The semiconductor integrated circuit according to claim 5, wherein the first equalizer and the second equalizer are each a transfer gate including an n-type MOS transistor and a p-type MOS transistor.

7. The semiconductor integrated circuit according to claim 4, wherein:

in the third period, the control circuit brings the second signal line into the floating state, and the first signal is input to the first signal line;

in the fourth period, the control circuit brings the first signal line and the second signal line into the floating state, and the equalizer circuit electrically connects the first part and the second part of the first signal line to each other, and electrically connects the third part and the fourth part of the second signal line to each other;

in the fifth period, the control circuit brings the first signal line into the floating state, and the second signal is input to the second signal line; and in the sixth period, the control circuit brings the first signal line and the second signal line into the floating state, and the equalizer circuit electrically connects the first part and the second part of the first signal line to each other, and electrically connects the third part and the fourth part of the second signal line to each other.

8. The semiconductor integrated circuit according to claim 7, wherein:

the first part and the second part of the first signal line have an equal wire length; and the third part and the fourth part of the second signal line have an equal wire length.

9. The semiconductor integrated circuit according to claim 4, wherein the control circuit generates a first control signal by use of the first clock signal and the second clock signal, and controls the equalizer circuit by use of the first control signal.

10. The semiconductor integrated circuit according to claim 9, further comprising:

a nonvolatile memory configured to store data;

a sense amplifier configured to read the data from the nonvolatile memory; and a data bus connected to the sense amplifier and configured to receive the data read from the nonvolatile memory and transmitted from the sense amplifier, the data bus including the first signal line and the second signal line.

11. The semiconductor integrated circuit according to claim 10, wherein the nonvolatile memory is a NAND flash memory.

12. The semiconductor integrated circuit according to claim 1, wherein at least a part of the first signal line and at least a part of the second signal line extend in the same direction and are arranged adjacent to each other.

13. The semiconductor integrated circuit according to claim 1, wherein:

a sum of a length of the third period and a length of the fourth period is equal to a length of the first period; and a sum of a length of the fifth period and a length of the sixth period is equal to a length of the second period.

14. The semiconductor integrated circuit according to claim 13, wherein:

the length of the first period and the length of the second period are equal to each other; and the length of the third period and the length of the fifth period are equal to each other.

15. The semiconductor integrated circuit according to claim 1, wherein each of the first signal line and the second signal line is a signal line through which signals are transmitted in both directions.

16. A method of controlling a semiconductor integrated circuit, the method comprising:

inputting a first signal to a first part of a first signal line including the first part and a second part in response to a first clock signal in a first period;

inputting a second signal to a third part of a second signal line including the third part and a fourth part in response to a second clock signal in a second period after the first period;

causing a first inverter arranged between the first part and the second part of the first signal line to output, to the second part, a first inverted signal obtained such that a logic of the first signal is inverted;

causing a second inverter arranged between the third part and the fourth part of the second signal line to output, to the fourth part, a second inverted signal obtained such that a logic of the second signal is inverted;

bringing the second signal line into a floating state in the first period, and bringing the first signal line into a floating state in the second period;

causing the first clock signal to transit between a first level and a second level different from the first level;

causing the second clock signal to transit between a third level and a fourth level different from the third level;

bringing the first clock signal into the first level and bringing the second clock signal into the fourth level in a third period as apart of the first period;

bringing the first clock signal into the second level d bringing the second clock signal into the fourth level in a fourth period as another part of the first period;

bringing the first clock signal into the second level and bringing the second clock signal into the third level in a fifth period as a part of the second period; and bringing the first clock signal into the second level and bringing the second clock signal into the fourth level in a sixth period as another part of the second period.

17. The method of controlling the semiconductor integrated circuit according to claim 16, further comprising:

in the third period, bringing the second signal line into the floating state, and inputting the first signal to the first signal line;

in the fourth period, bringing the first signal line and the second signal line into the floating state, and electrically connecting the first part and the second part of the first signal line to each other, and electrically connecting the third part and the fourth part of the second signal line to each other;

in the fifth period, bringing the first signal line into the floating state, and inputting the second signal to the second signal line; and in the sixth period, bringing the first signal line and the second signal line into the floating state, and electrically connecting the first part and the second part of the first signal line to each other, and electrically connecting the third part and the fourth part of the second signal line to each other.

* * * * *